United States Patent [19]

Ketcham

[11] Patent Number: 5,231,327
[45] Date of Patent: Jul. 27, 1993

[54] OPTIMIZED PIEZOELECTRIC RESONATOR-BASED NETWORKS

[75] Inventor: Richard S. Ketcham, Ames, Iowa

[73] Assignee: TFR Technologies, Inc., Redmond, Oreg.

[21] Appl. No.: 628,440

[22] Filed: Dec. 14, 1990

[51] Int. Cl.⁵ ............................................. H01L 41/08
[52] U.S. Cl. ..................................... 310/366; 310/320
[58] Field of Search ....................... 310/320, 321, 366; 333/187–191

[56] References Cited

U.S. PATENT DOCUMENTS

| | | | |
|---|---|---|---|
| 3,222,622 | 12/1965 | Curran et al. | 310/320 |
| 3,401,275 | 9/1968 | Curran et al. | 310/320 |
| 3,401,276 | 9/1968 | Curran et al. | 310/320 |
| 3,437,848 | 4/1969 | Borner et al. | 333/72 |
| 3,486,046 | 12/1969 | Zalar | 310/320 X |
| 3,528,851 | 9/1970 | Koneval et al. | 310/320 X |
| 3,548,346 | 12/1970 | Page | 310/320 X |
| 3,558,351 | 1/1971 | Foster | 117/204 |
| 3,564,463 | 2/1971 | Beaver et al. | 333/72 |
| 3,568,108 | 3/1971 | Poirier et al. | 333/72 |
| 3,573,960 | 4/1971 | Duncan | 117/38 |
| 3,576,453 | 4/1971 | Mason | 310/320 X |
| 3,634,787 | 1/1972 | Newell | 333/72 |
| 3,676,724 | 7/1972 | Berlincourt et al. | 310/320 |
| 3,697,788 | 10/1972 | Parker et al. | 310/9.5 |
| 3,739,304 | 6/1973 | Braun | 333/72 |
| 3,747,176 | 7/1973 | Toyoshima | 310/340 X |
| 3,766,041 | 10/1973 | Wasa et al. | 204/192 |
| 3,846,649 | 11/1974 | Lehmann et al. | 310/8 |
| 3,924,312 | 12/1975 | Coussot et al. | 29/25.35 |
| 3,961,210 | 6/1976 | Nagata et al. | 310/320 |
| 4,066,986 | 1/1978 | Takano et al. | 310/320 |
| 4,142,124 | 2/1979 | Ogawa et al. | 310/360 |
| 4,149,102 | 4/1979 | Kellen | 310/320 |
| 4,163,959 | 8/1979 | Dailing | 310/366 X |
| 4,164,676 | 8/1979 | Nishiyama et al. | 428/539 |
| 4,189,516 | 2/1980 | Dryburgh et al. | 428/409 |
| 4,196,407 | 4/1980 | Masaie et al. | 310/366 X |
| 4,214,018 | 7/1980 | Halon et al. | 427/100 |
| 4,218,631 | 8/1980 | Yamaguchi | 310/320 X |
| 4,229,506 | 10/1980 | Nishiyama et al. | 428/539 |
| 4,297,189 | 10/1981 | Smith, Jr. et al. | 204/192 SP |
| 4,302,108 | 11/1981 | Timson | 356/359 |
| 4,320,365 | 3/1982 | Black et al. | 333/187 |
| 4,329,666 | 5/1982 | Arvanitis | 333/191 |
| 4,345,176 | 8/1982 | Grudkowski et al. | 310/313 A |
| 4,360,754 | 11/1982 | Tokoshima et al. | 310/366 |
| 4,365,181 | 12/1982 | Yamamoto | 310/320 |
| 4,456,850 | 6/1984 | Inoue et al. | 310/324 |
| 4,480,488 | 11/1984 | Read et al. | 73/862.68 |
| 4,502,932 | 3/1985 | Kline et al. | 204/192 EC |
| 4,556,812 | 12/1985 | Kline et al. | 310/324 |
| 4,640,756 | 2/1987 | Wang et al. | 204/192.18 |
| 4,642,508 | 2/1987 | Suzuki et al. | 333/72 |
| 4,719,383 | 1/1988 | Wang et al. | 310/324 |
| 4,760,358 | 7/1988 | Inoue | 310/366 X |
| 4,833,430 | 5/1989 | Roberts et al. | 310/320 |
| 4,920,296 | 4/1990 | Takahashi et al. | 310/320 X |
| 5,041,754 | 8/1991 | Smythe | 310/366 |
| 5,075,651 | 12/1991 | Pradal | 333/187 |

FOREIGN PATENT DOCUMENTS 0031609  2/1983  Japan .................................. 310/324

*Primary Examiner*—Mark O. Budd
*Attorney, Agent, or Firm*—Klarquist, Sparkman, Campbell, Leigh & Whinston

[57] ABSTRACT

The method comprises decomposing an original resonator within a network into a pair of series connected resonators to add an additional connecting electrode to the network. The pair of resonators are series connected by a shared electrode. To preserve the original electrical characteristics of the network, the composite characteristics of the series connected resonators are chosen to match those of the original resonator. With this method, the additional electrode is placed on a surface of the piezoelectric material opposing the surface to which the shared electrode is mounted. The method allows for the addition of an electrode to a piezoelectric resonator-based network so that the electrodes which connect the network to other circuitry may be placed where desired. This may be on the upper surface of the piezoelectric material for connection to discrete components or on the lower, buried surface for connection to buried layers of an adjacent integrated circuit.

10 Claims, 27 Drawing Sheets

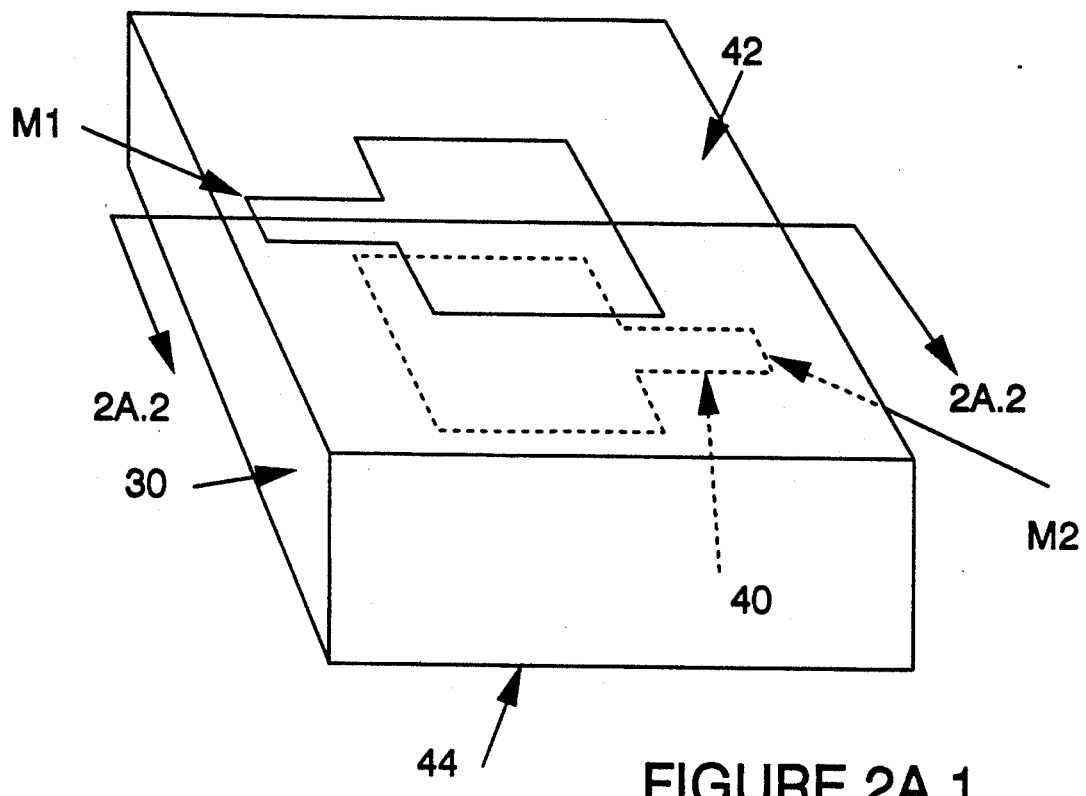
FIGURE 2A.1
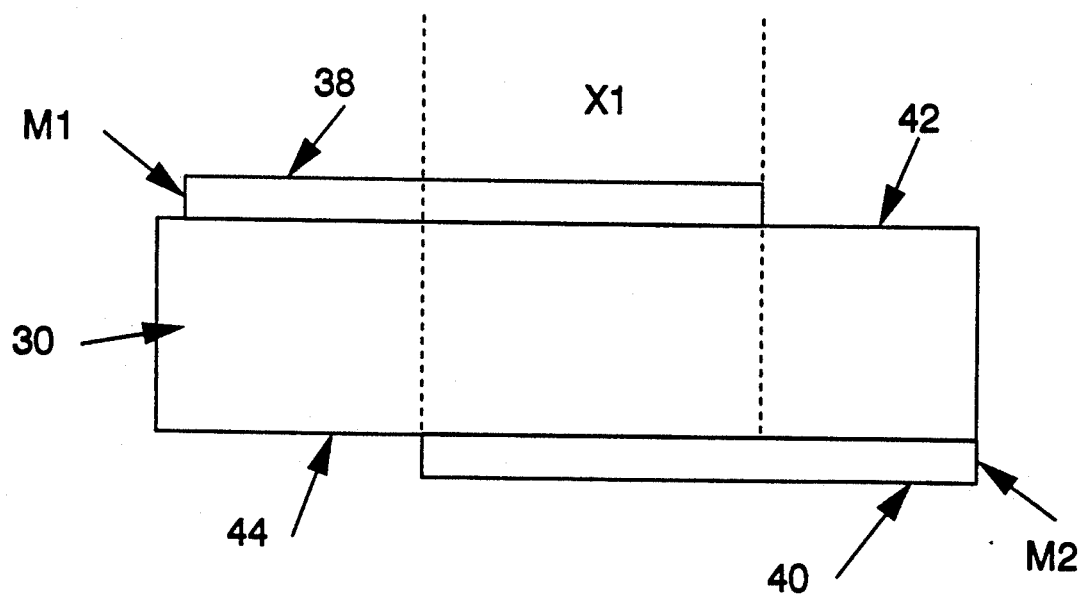
PRIOR ART
FIGURE 2A.2

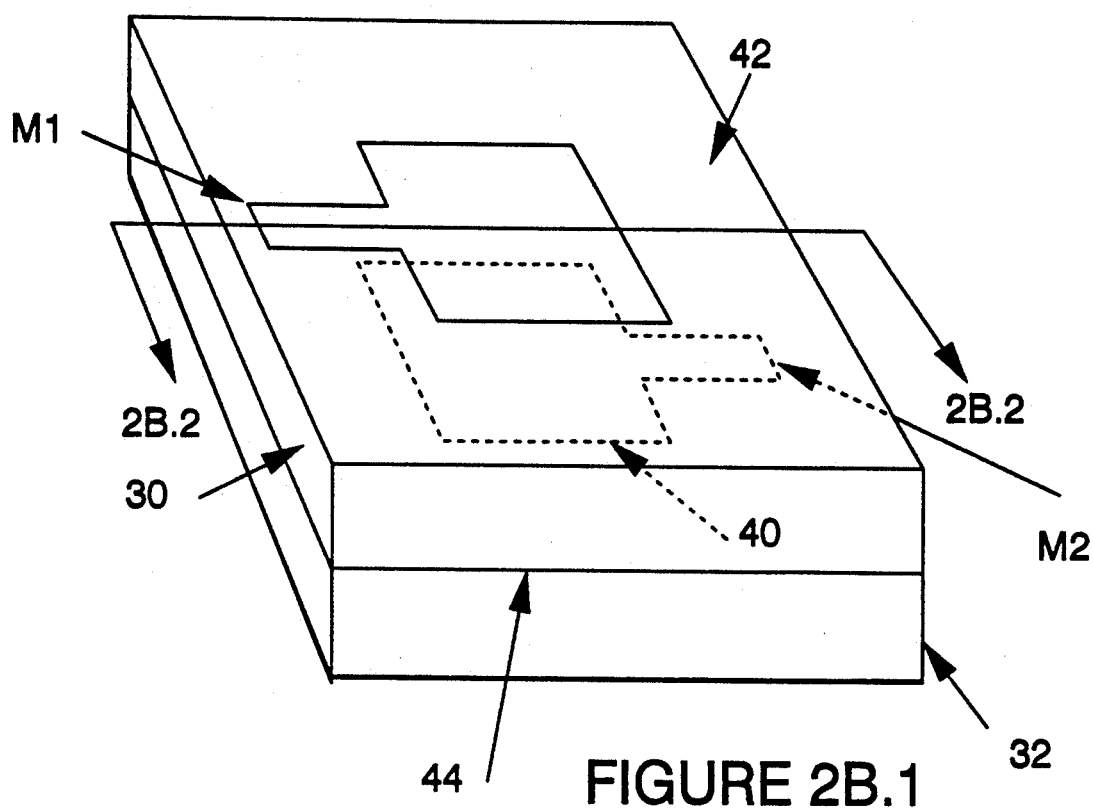
FIGURE 2B.1
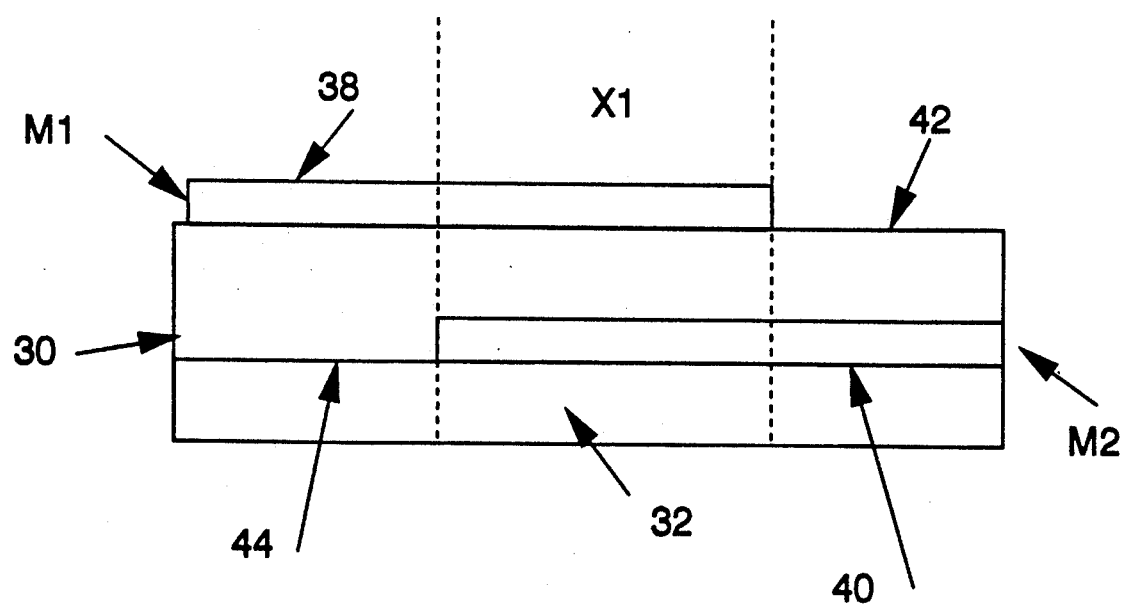
PRIOR ART
FIGURE 2B.2

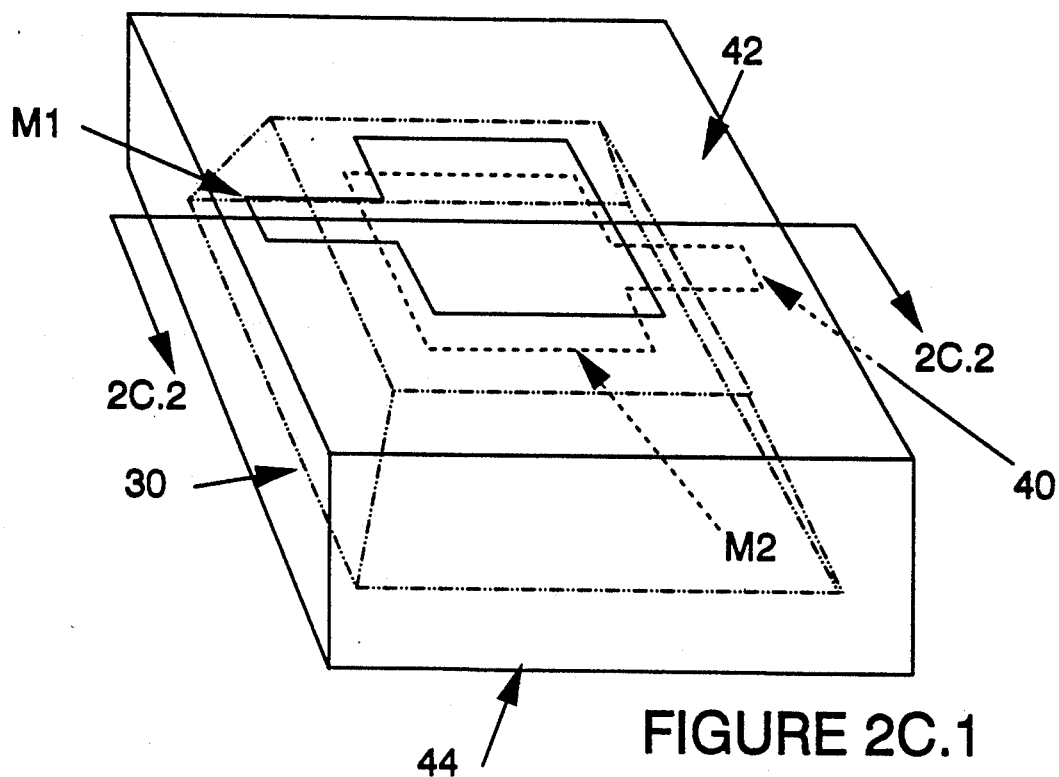
FIGURE 2C.1
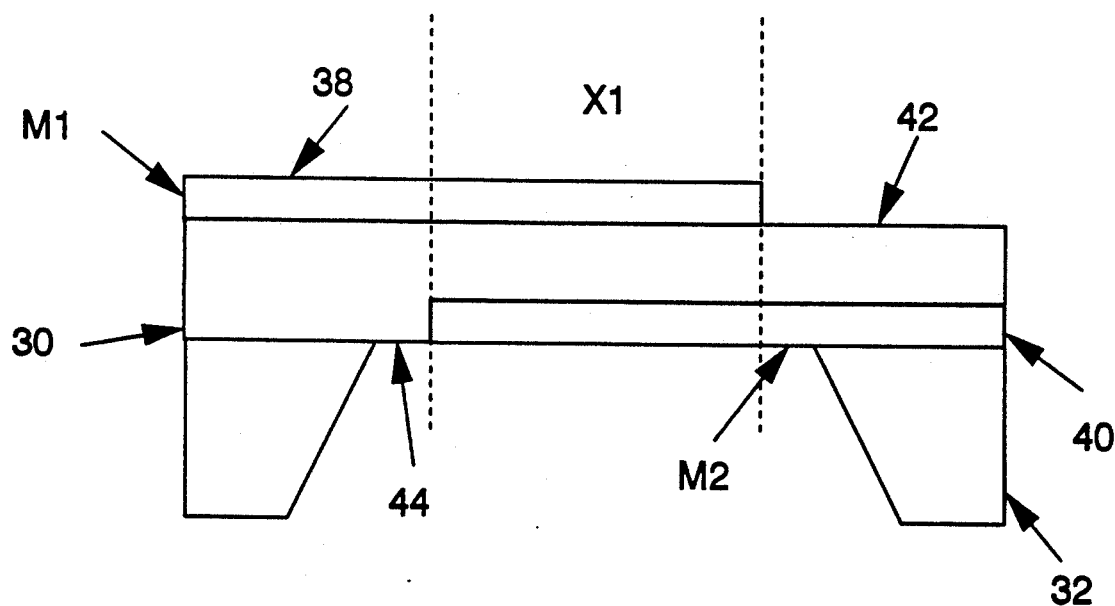
PRIOR ART
FIGURE 2C.2

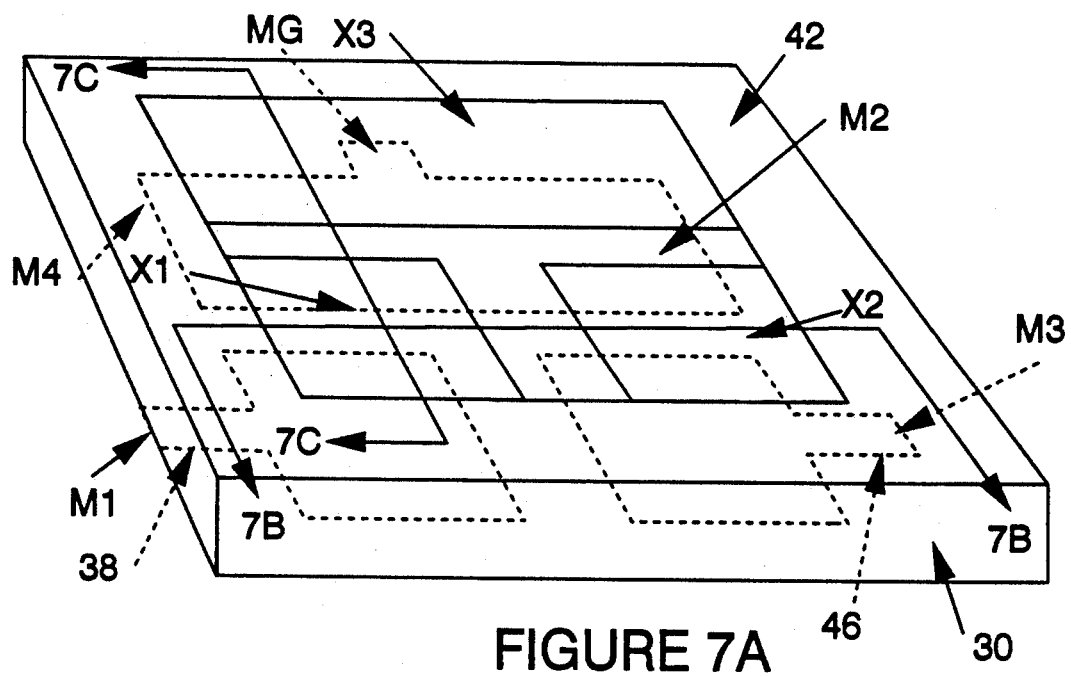
FIGURE 7A
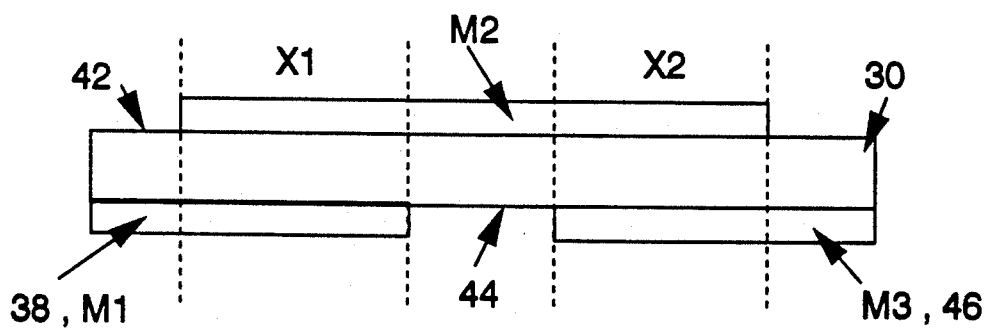
FIGURE 7B
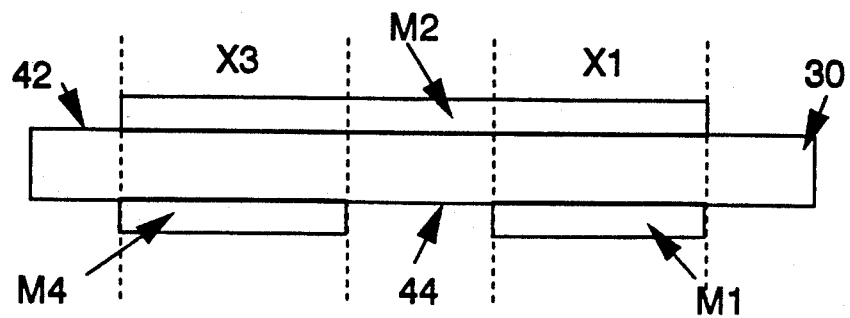
PRIOR ART FIGURE 7C

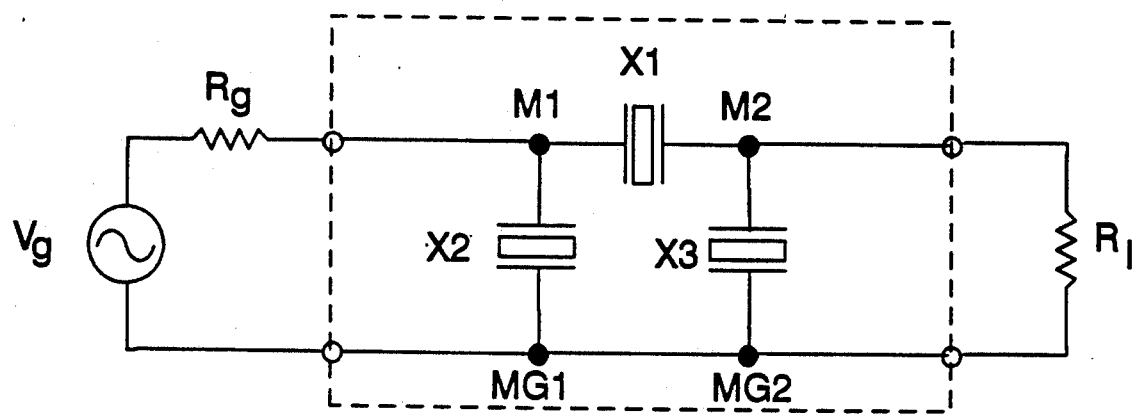
PRIOR ART  FIGURE 11

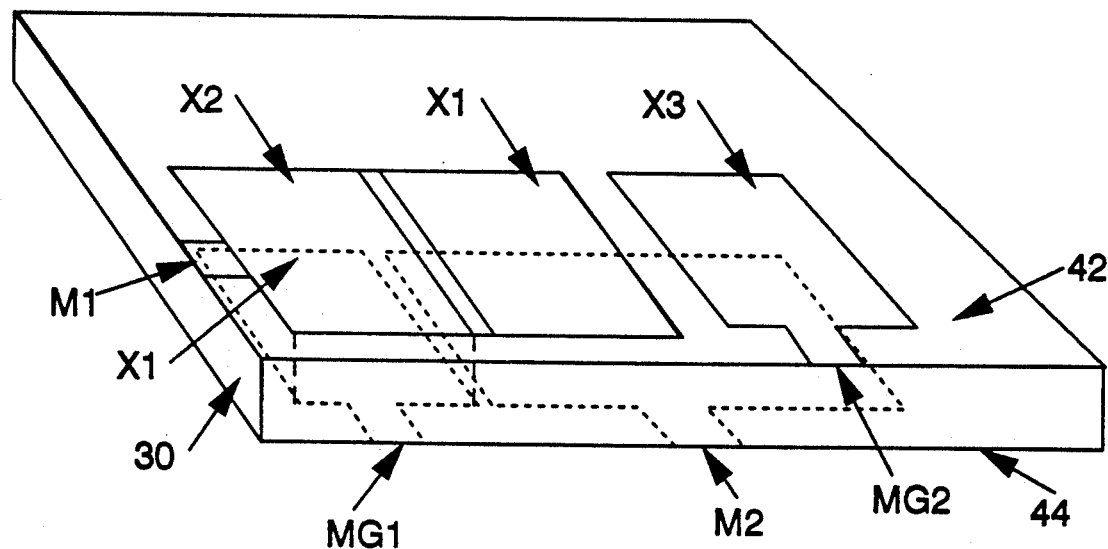
PRIOR ART  FIGURE 12

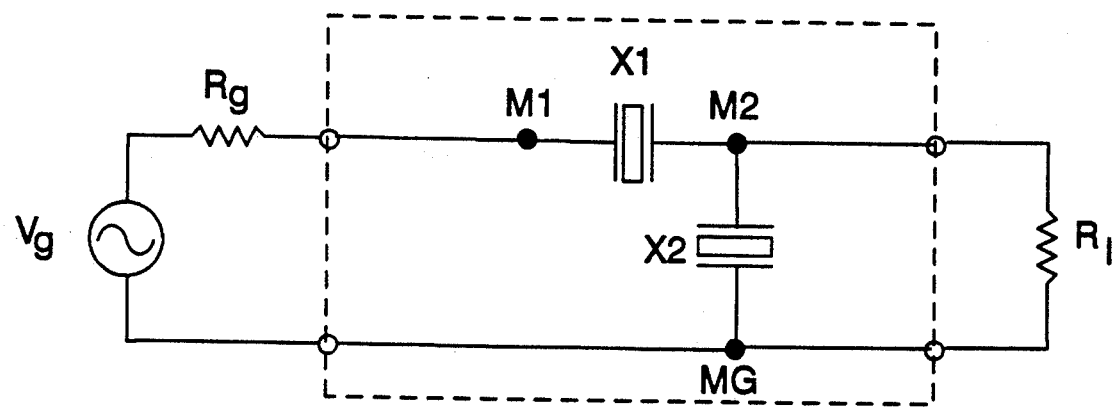
PRIOR ART    FIGURE 16

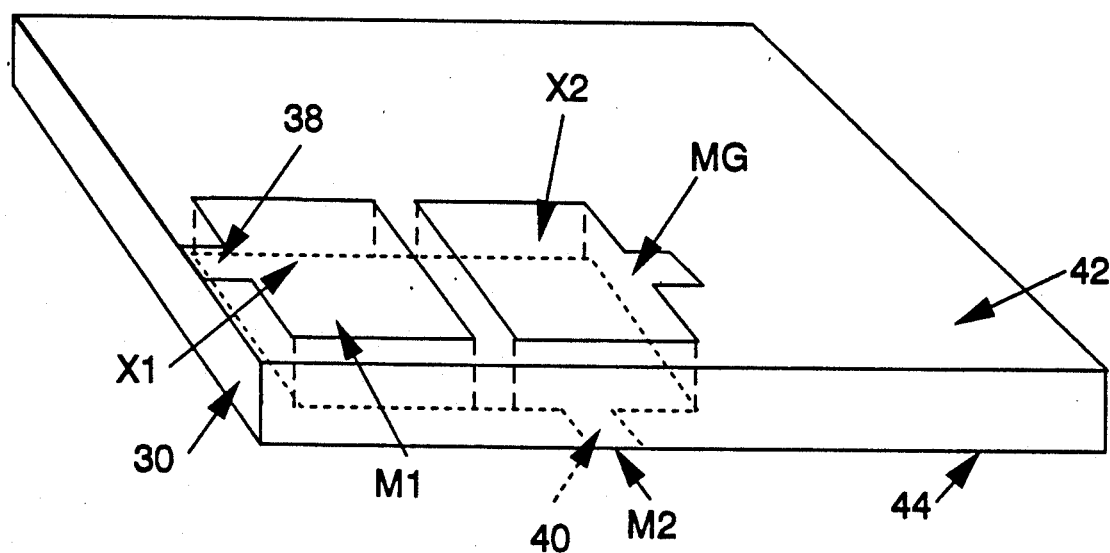
PRIOR ART    FIGURE 17

PRIOR ART FIGURE 22

OPTIMIZED PIEZOELECTRIC RESONATOR-BASED NETWORKS

BACKGROUND OF THE INVENTION

This invention relates to piezoelectric resonators and, specifically, to a method for optimizing the topology of a piezoelectric resonator-based network so that it may be implemented, either in monolithic or discrete form, with interconnects on one or either principal face of a piezoelectric plate or membrane.

A typical prior piezoelectric resonator comprises a wafer of piezoelectric material such as quartz or ceramic material provided with electrodes mounted on the wafer's opposing lateral surfaces Upon application of an alternating voltage to the electrodes, the piezoelectric material is driven electrically in a predetermined vibrational mode, for example, thickness shear, thickness extensional, etc., depending on the orientation or polarization of the piezoelectric material. The resonant frequency of the resonator is dependent on the overall wafer and electrode thickness and increases with a decrease in thickness. At high frequencies very thin wafers, plates, or films are required in order to have a half wavelength established across the thickness. These thin structures may be formed by thin film deposition onto a suitable substrate which leaves one principal surface of the material relatively inaccessible for interconnects. Resonators may be fabricated from these thin film and through different network configurations or with additional circuitry, such resonators can be combined to form filters or oscillators.

Prior resonators have been constructed in a number of ways. The most prevalent method is to construct individual resonators, mount and package them and then connect the packaged resonators into various circuit configurations. In an effort to reduce the overall circuit size, more than one resonator may be fabricated on a single plate of piezoelectric material and then interconnected on the plate to form a circuit. As shown in U.S. Pat. No. 3,222,622, the wafer may be cut to a desired thickness and the electrodes then mounted on opposing surfaces of the wafer. Another approach exemplified in U.S. Pat. No. 3,590,287 is to utilize a deposition process. The electrodes and piezoelectric material are deposited as metalization layers and a thin film, respectively, on a substrate such as a quartz wafer.

Although satisfactory resonators can be constructed with these techniques, they have their drawbacks. In both cases the two opposing electrodes of the resonator are on opposing lateral surfaces of the piezoelectric material and not coplanar. These electrodes, which connect the resonator to other circuitry such as integrated circuits or discrete components, may not be favorably positioned for making such connections. This is especially true if the piezoelectric material rests on a substrate and the electrode between the two materials is thus buried. Connecting the buried electrode to a discrete component such as a resistor is quite difficult. The situation is further complicated by the desirability of production testing as many as 600 piezoelectric resonator networks on each 4-inch-diameter wafer substrate prior to final assembly. Microwave probe testing requires all interconnect electrodes be on the top surface of the piezoelectric film.

One solution suggested in U.S. Pat. No. 3,222,622 is to provide a nonplanar conductive interconnect between a poorly positioned electrode and an additional electrode mounted in a more favorable position Connections to other circuitry may then be made from the additional electrode. As shown therein, an interconnect in the form of a discrete wire is added to a pi-network to connect an electrode mounted on the lower surface of the piezoelectric material to an electrode mounted on the upper surface of the material. The interconnect extends around the edge of the material, and is added as an additional step in the process of constructing the resonator.

An alternative solution might be to fabricate a via interconnect that extends through the piezoelectric material to make the desired connection. The interconnect is fabricated with additional steps in the process of constructing the resonator.

Neither of these solutions, however, is conducive to high volume, low cost manufacturing and testing by microelectronic techniques. Both add additional, costly steps to the manufacturing process. Within the microelectronic manufacturing context piezoelectric resonator networks must be designed and patterned to be compatible with manufacturing methods not employed within the conventional quartz crystal industry.

SUMMARY OF THE INVENTION

Therefore, an object of the invention is to provide a method for optimizing the topology of a piezoelectric resonator-based network which overcomes the drawbacks of the prior art Another object of the invention is to provide piezoelectric resonator-based networks in which electrodes may be selectively placed on the piezoelectric material to provide desired connections to other circuitry without the need for additional, nonplanar interconnects.

In accordance with these objects, the method of the invention comprises decomposing an original resonator within a network into a pair of serially connected resonators which share a common electrode. The composite characteristics of the serial connected resonators are chosen to match the characteristics of the original resonator. By such decomposition, an additional electrode is added to the network and is placed on the piezoelectric material surface opposing the surface to which is mounted the shared electrode for making a desired connection to other circuitry. The method does not require a nonplanar interconnect for connecting an electrode on one surface of the piezoelectric material to circuitry present at the opposing surface. The invention thereby eliminates the difficulty of providing access to electrodes of the resonator network for connection to other circuitry or for wafer scale testing during manufacturing.

The invention is applicable to monolithic resonator circuits as well as to discrete resonator circuits.

The foregoing and other objects, features, and advantages of the invention will become more apparent from the following detailed description of several preferred embodiments which proceeds with reference to the following drawings.

BRIEF DESCRIPTION OF THE DRAWINGS

FIGS. 2A.1 and 2A.2 are perspective and embodiment of the resonator represented in FIG. 1.

FIGS. 2B.1 and 2B.2 are perspective and cross sectional views a second embodiment of the resonator represented in FIG. 1 including a full substrate supporting the piezoelectric material.

FIGS. 2C.1 and 2C.2 are perspective cross sectional views of a third embodiment of the resonator represented in FIG. 1 including a partial substrate supporting the piezoelectric material.

FIGS. 7A-C are perspective and implementation of the T network represented in FIG. 6

FIG. 11 is a schematic diagram of an electrical circuit that includes a pi network comprising piezoelectric resonators.

FIG. 12 is a perspective view of a monolithic implementation of the pi network represented in FIG. 11.

FIG. 16 is a schematic diagram of an electrical circuit that includes an L network comprising piezoelectric resonators and shunt elements FIG. 17 is a perspective view of a monolithic implementation of the L network represented in FIG. 16.

DESCRIPTION OF PREFERRED EMBODIMENTS

Prior Art Design

Figure 1:
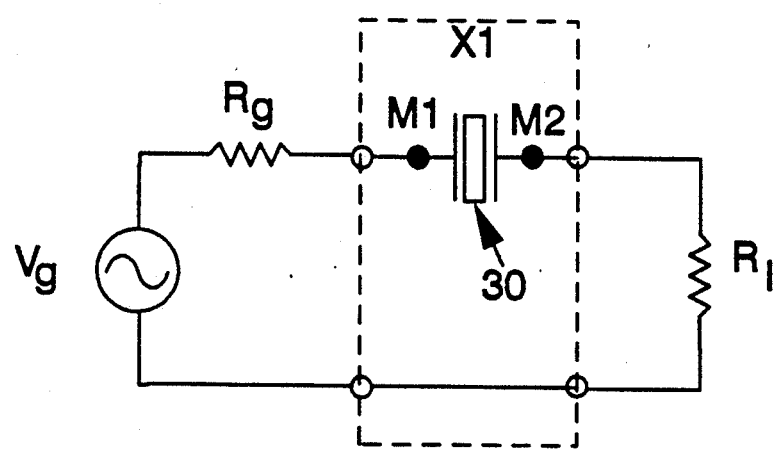
FIG. 1 is a schematic diagram of an electrical circuit that includes a piezoelectric resonator.

Referring now to FIG. 1, there is shown a schematic diagram of an electrical circuit that includes a piezoelectric resonator X1. Resonator X1 is of conventional design and includes a pair of electrodes M2 and M2 mounted on opposing surfaces of piezoelectric material 30. The resonator X1 is shown connected within an electrical circuit that includes a voltage source $V_8$ in series with a generator impedance represented by resistor $R_8$. The resistor $R_8$ is connected to the first electrode M1 of resonator X1. The second electrode M2 is connected to a load impedance represented by resistor $R_1$, which in turn is also connected to the voltage source $V_8$ to complete the circuit. Resonator X1 in this circuit is a filter, with electrode M2 receiving an input signal and electrode M2 providing an output signal. As a filter, resonator X1 passes electrical signals with the same frequency as its piezoelectric material's series resonant frequency and attenuates or suppresses signals of other frequencies.

FIGS. 2A-C show different possible embodiments (not to scale) of the resonator X1 based on the circuit topology of FIG. 1. FIGS. 2A.1 and 2A.2 illustrate a bulk crystal resonator X1 comprising overlapping, opposing electrodes M1 and M2 mounted on opposing surfaces of the piezoelectric material 30. To construct the resonator using known techniques, the crystal material is placed in a vacuum chamber and the metal for electrodes M1 and M2 is introduced as a vapor that deposits on the material's surfaces 42 and 44. The metal is then etched to form the desired electrodes. Resonators of this type are typically driven at their fundamental frequency. The portion of the embodiment between the dashed lines in FIG. 2A.2 forms the actual resonator X1. The portion 38 of electrode M1 outside the dashed lines forms a lead for interconnecting the resonator to other circuit elements such as resistor $R_8$. Similarly, the portion 40 of electrode M2 outside the dashed lines forms a lead for interconnecting the resonator to other circuit elements such as resistor $R_1$.

FIGS. 2B.1 and 2B.2 show a second embodiment of the resonator X1. Electrode M2 is deposited as a metal layer on a supporting substrate 32 such as silicon for a transducer or resonator. Deposited on top of layer M2 is a film of piezoelectric material 30. To complete the resonator X1 the metal layer M1 is deposited on top of the piezoelectric material 30. This embodiment may be used, for example, where it is desirable to place the resonator on a semiconductor wafer for interconnection to portions of adjacent integrated circuits. As is known in the art, the supporting substrate underneath the actual resonator X1 changes the electrical characteristics of the resonator from that of FIG. 2A. The resonator of FIG. 2B is an overmoded resonator and is operated at high harmonics of the fundamental frequency.

FIGS. 2c.1 and 2C.2 show a third embodiment of the resonator X1 in which a selected part of the substrate 32 directly below the resonator has been removed. The remaining substrate has no effect on the electrical characteristics of the resonator. The resonator X1 in FIG. 2C can thus have the same electrical characteristics as the resonator X1 in FIG. 2A, and may be constructed on a semiconductor water for interconnection to other circuitry on the substrate.

For the sake of simplicity, the present invention and prior art will be further described only with respect to resonators of a type such as shown in FIGS. 2C.1 and 2C.2 with substrate 32 eliminated from the drawings. It should be understood, however, that the invention is also equally applicable to other types of resonators such as those shown in FIGS. 2A and 2B.

A drawback of the conventional topology of FIG. 1 and resultant embodiments of FIGS. 2A-C is the consequent nonplanar locations of the electrodes M1 and M2. The lead 40 of electrode M2, for example, is mounted to the lower surface of the piezoelectric material 30 and, if substrate 32 is present, buried between the substrate and piezoelectric material 30. To connect lead 40 to a discrete component such as resistor $R_1$ requires a bonding pad on the upper surface 42 of material 30 and either (1) a discrete nonplanar interconnect from the electrode M2 around the edge of the piezoelectric material (as in U.S. Pat. No. 3,222,622) or (2) a via interconnect through the material 30 to its upper surface. If, on the other hand, resistors $R_8$ and $R_1$ are implemented in monolithic form on substrate 32, it may be desirable to connect to resistor $R_8$ on the substrate 32 at the lower surface 44 of the material 30. This connection would require a interconnect from electrode M1 to the lower surface.

Regardless of where connections are desired, both connecting options are poor. A discrete nonplanar interconnect is too costly to design into a monolithic implementation with wafer scale manufacturing via interconnect requires forming a high definition hole in the piezoelectric material 30 and depositing conducting material into the hole to electrically connect an electrode to the opposing material surface. In typical piezoelectric resonators, extremely high height-to-width ratios ar encountered which affect the reliability of such internal interconnects. Reducing the ratio, however, requires that the width of the via be increased This in turn may unacceptably increase the lateral area required for the via. Moreover, forming the via interconnect would require additional fabrication processing steps and the processing steps and chemical composition might not be compatible with the substrate 32 material.

The Method of the Invention

The present invention provides a method of optimizing the topology of a piezoelectric resonator-based network so that nonplanar interconnects are not required for making such connections. The method, which is applicable to the single resonator of FIG. 1 as well as to multiple resonator networks to be discussed, places additional electrodes where they are desired and provides a resonator network with electrical characteristics equivalent to the characteristics of the original resonator network.

Figure 3:
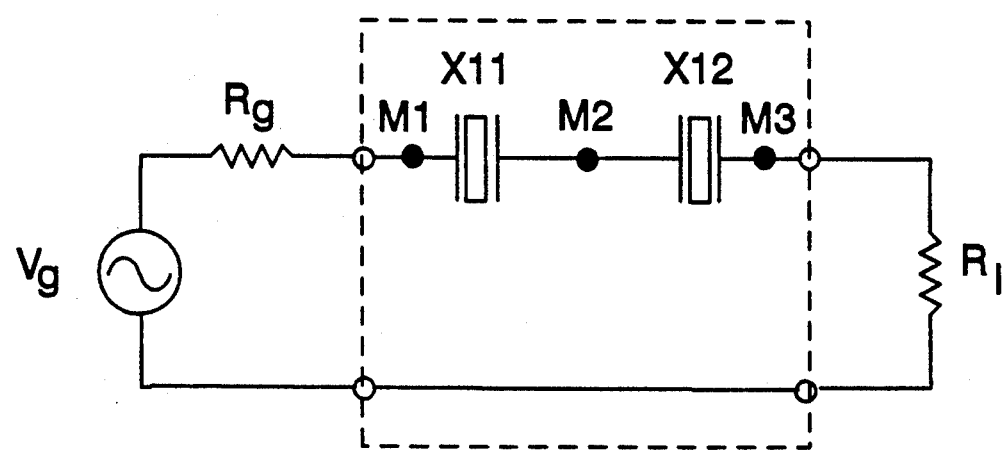
FIG. 3 is a schematic diagram of an equivalent resonator formed by decomposing the original resonator into a pair of series connected resonators.

FIG. 3 is a schematic diagram of a resonator equivalent to the resonator of FIG. 1 in which the topology is optimized for placing an additional electrode. The optimized network is formed by decomposing resonator X1 into a pair of series connected resonators X11 and X12. This decomposition in the present embodiment comprises locating a resonator in the network, such as X2, and replacing it with two series connected resonators X11 and X12 which are connected only to each other at a shared electrode M2. Electrode M2 is referred to as a floating electrode since it does not connect the resonators to other circuitry. Electrodes M1 and M3, on the other hand, are referred to as connecting electrodes since they connect the network to other circuitry, such as resistors $R_8$ and $R_1$, The two series resonators X11 and X12 are designed to have composite characteristics that match those of the resonator X1 to preserve the original characteristics of the resonator. From a functional point of view, the resonators of FIG. 3 are equivalent to the resonator of FIG. 1, but an additional electrode M3 has been added which replaces electrode M2 as a connecting electrode to other circuitry.

Figure 4A:
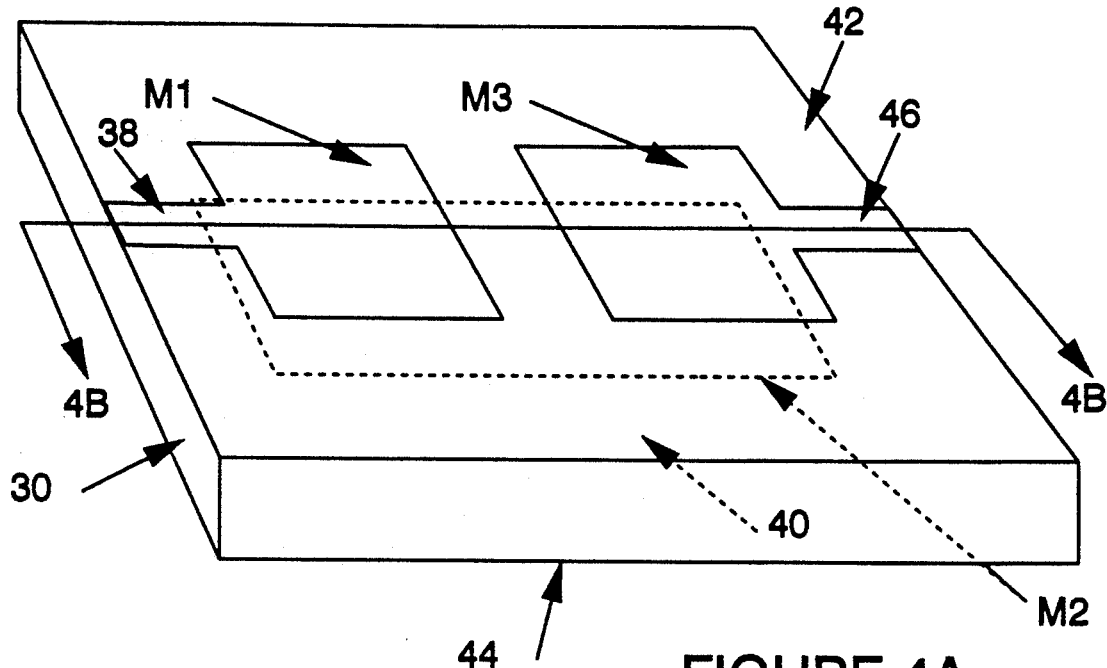
FIGS. 4-B are perspective and cross sectional views of an implementation of the series connected resonators of FIG. 3 such that both electrodes are on the top surface.
Figure 4B:
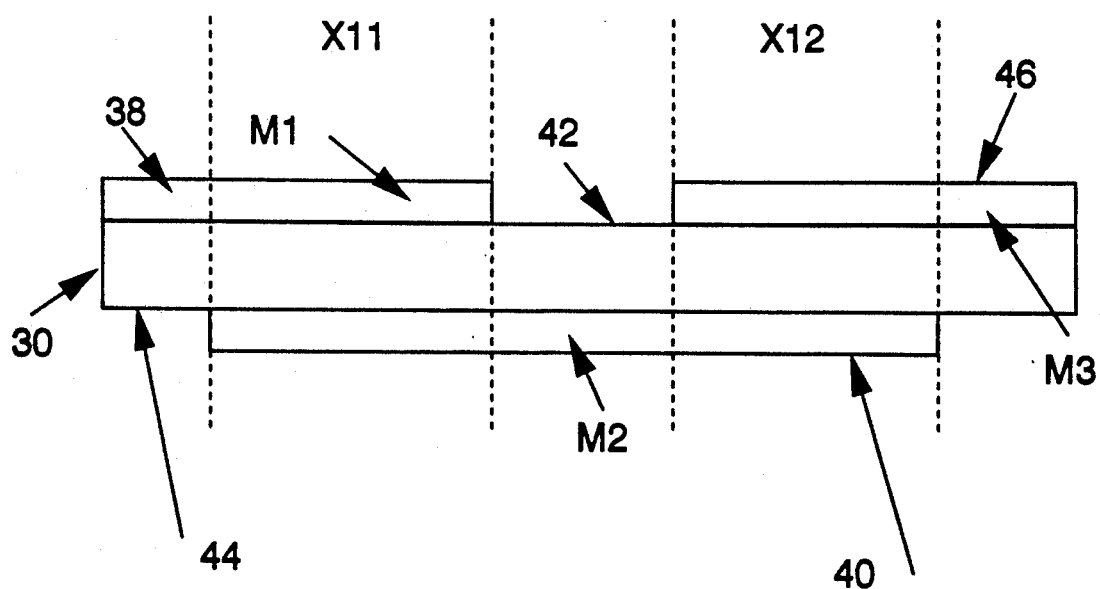

The difference between the conventional and new circuit topologies can be seen in the perspective cross sectional views of the implementation of the equivalent circuit in FIGS. 4A-B. Whereas the electrodes that connect to other circuitry were on opposing surfaces of piezoelectric material 30 in FIGS 2A-C, they are now on the same surface in FIG. 4 because of the addition of the third electrode M3. Electrodes M1 and M3 now form such a pair of planar connecting electrodes mounted to surface 42 of the piezoelectric material 30. Electrode M2, which is shared by resonators X11 and X12, is mounted to the opposing surface 44. Electrode M1 and M3 are mounted in overlapping relation to electrode M2 to create two series connected resonators that are connected only to each other at electrode M2. Electrode M2 is thus a floating electrode that does not connect to other circuitry. By decomposing the resonator X1 into the series connected resonators X11 and X12, the third electrode M3 is added on a surface opposing the surface on which the shared electrode M2 resides. This arrangement allows the network to connect to resistors $R_8$ and $R_1$ through leads 38 of electrode M1 and lead 46 of electrode M3. If desired, electrodes M1 and M3 could as easily be placed on the lower surface 44 (if $R_8$ and $R_1$ were substrate-based resistors) by reversing the implementation's fabrication steps.

The method is not limited to placing connecting electrodes on the same surface of the piezoelectric material, but may be employed for placing them on opposing surfaces as well. This may occur, as will be seen, where a connection to an adjacent integrated circuit is desired at the lower surface 44 as well as a connection to a discrete component at the upper surface 42.

The method for optimizing the circuit topology therefore comprises the following steps. First an electrical resonator in the network is decomposed into a pair of series connected resonators to add an additional electrode to the network, the resonators sharing a common electrode. The composite characteristics of the series connected resonators are matched to those of the original resonator to preserve the original characteristics of the network. In the implementation of FIG. 4, this matching is done by changing the overlapping areas of the electrodes M1,M2 and M3,M2 so that the bulk capacitance of each series connected resonator X11, X12 is double the original bulk capacitance of resonator X1:

$$C_{X11} = C_{X12} = 2C_{X1}$$

The additional electrode is then placed on a surface of the piezoelectric material 30 opposing the surface to which the shared electrode is mounted for making the desired connection. For example, a one GigaHz aluminum nitride resonator 400 micrometers × 400 micrometers × 5 micrometers thick has a capacitive reactor of 50 ohms. Such a resonator could be decomposed into two resonators each 566 micrometers × 566 micrometers and series connected. The increase in device area caused by the decomposition is partially offset by not having to etch a via to gain access to bottom electrode or provide for insulating the bottom electrode extension from substrate 32.

Figure 5A:
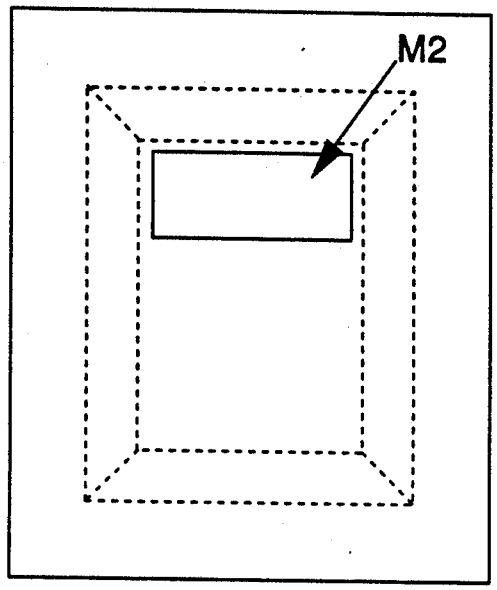
FIGS. 5A-D illustrate the process for fabricating the series connected resonators of FIG. 4.
Figure 5B:
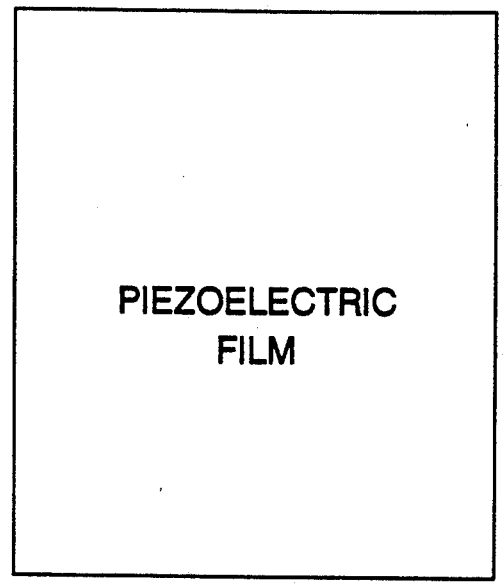
Figure 5C:
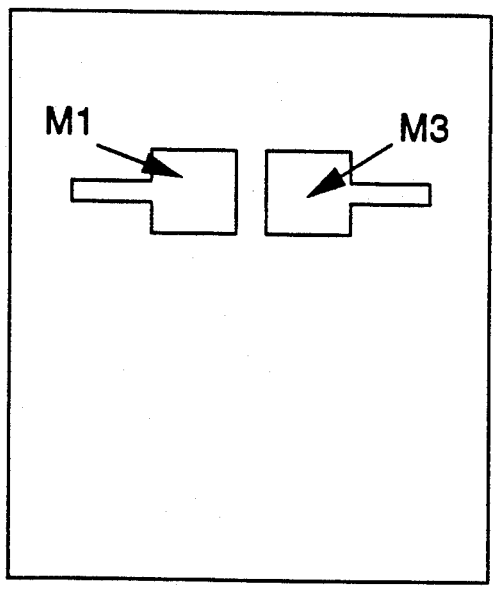
Figure 5D:
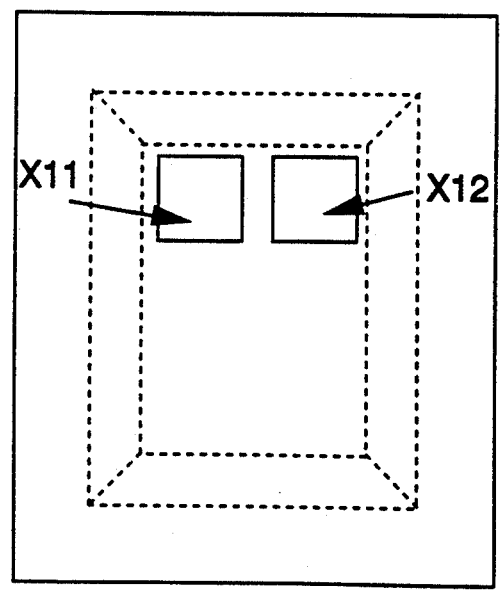

FIGS. 5A–D illustrate the process for fabricating the series connected resonators of FIG. 3 as implemented in FIG. 4 on a substrate 32. FIG. 5A shows the first layer metalizations that form electrode M2. FIG. 5B shows the deposition of the piezoelectric material 30. FIG. 5C shows a second layer metalization that forms electrodes M1 and M3. FIG. 5D is a schematic view showing the relative locations of resonators X11 and X12 within the implementation.

The described method may be applied to any resonator network for the purpose of placing an additional connecting electrode on a desired surface of the piezoelectric material 30. In the embodiment described above, the additional connecting electrode was placed on the same surface as the connecting electrode M2 was placed. It may be desirable in some cases, however, to place an additional connecting electrode on the surface opposing the other connecting electrode so that the connections to other circuitry are on opposing surfaces of the piezoelectric material 30.

Figure 6:
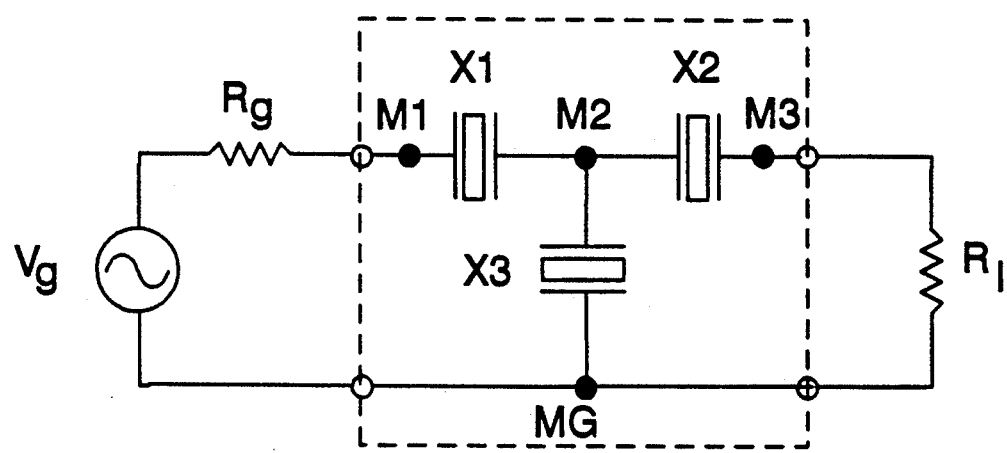
FIG. 6 is a schematic diagram of an electrical circuit that includes a T network comprising several piezoelectric resonators and/or shunt elements

FIG. 6 is a schematic diagram of an electrical circuit that includes a T resonator network. The T network comprises resonator X1, a series resonator X2 and a shunt element such as piezoelectric resonator X3. All of the resonators share a common electrode M2. Electrode M1 connects the T network via resonator X1 to other circuitry such as resistor $R_8$ and electrode M3 connects the network via resonator X2 to other circuitry such as resistor $R_1$. Another electrode MG connects the network via resonator X3 to signal ground. Electrode M2 in this network is a floating electrode.

FIGS. 7A–C are perspective and cross sectional views of an implementation of the T network based on the circuit topology of FIG. 6. Electrodes M1, M3, and MG are mounted as a coplanar metal layers on supporting substrate 32. Deposited on top of these electrodes is the film of piezoelectric material 30. To complete resonators X1, X2 and X3, the metal layer M2 is deposited on the upper surface 42 of the piezoelectric material 30. The portions of the implementation between pairs of dashed lines form the resonators X1, X2, and X3, respectively. The darker shading of FIG. 7A illustrates the top and bottom electrode overlap regions that form resonators X1, X2, and X3. The portion 38 of electrode M1 outside resonator X1 forms a lead for interconnecting the resonator to other circuit elements such as resistor $R_8$. Similarly, the portion 46 of electrode M3 outside the dashed lines defining resonator X2 forms a lead for interconnecting the resonator to other circuit elements such as resistor $R_1$. Both electrodes M1 and M3 are buried between substrate 32 (not shown) and material 30.

Figure 8:
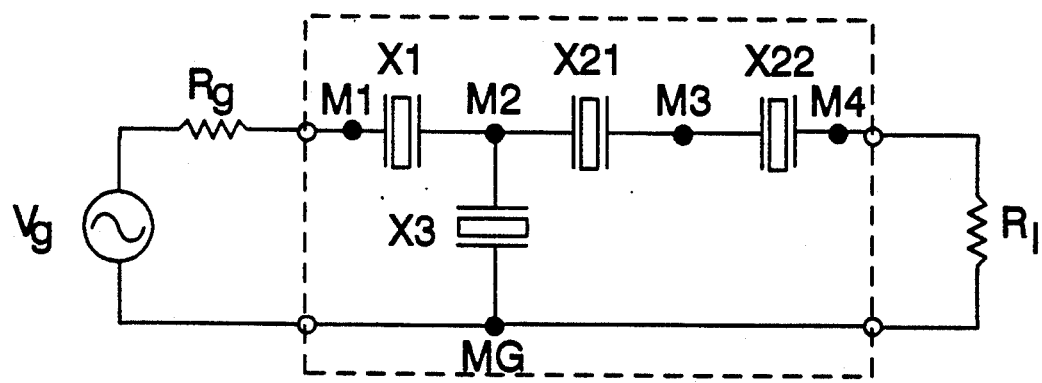
FIG. 8 is a schematic diagram of an equivalent T network formed by decomposing a resonator in the T network into a pair of series connected resonators.

If it is desired to make a connection to the network at the upper surface 42 of piezoelectric material 30, the method of the present invention is employed to optimize the network's topology for that purpose. FIG. 8 is a schematic diagram of an equivalent T network formed by decomposing resonator X2 into a pair of series connected resonators X21 and X22. Resonators X1 and X21 form a pair of series connected resonators sharing a first electrode M2. Resonator X3 is a shunt element that also connects to electrode M2 and to signal ground via electrode MG. A resonator X22 is series connected to resonator X21 at electrode M3. But unlike other electrodes within the T network, only the two resonators are connected at electrode M3. The additional resonator X22 adds an additional connecting electrode M4 to the T network. The composite characteristics of the series connected resonators are chosen to match the characteristics of resonator X2 which they replace so that the network's electrical characteristics remain unchanged.

Figure 9A:
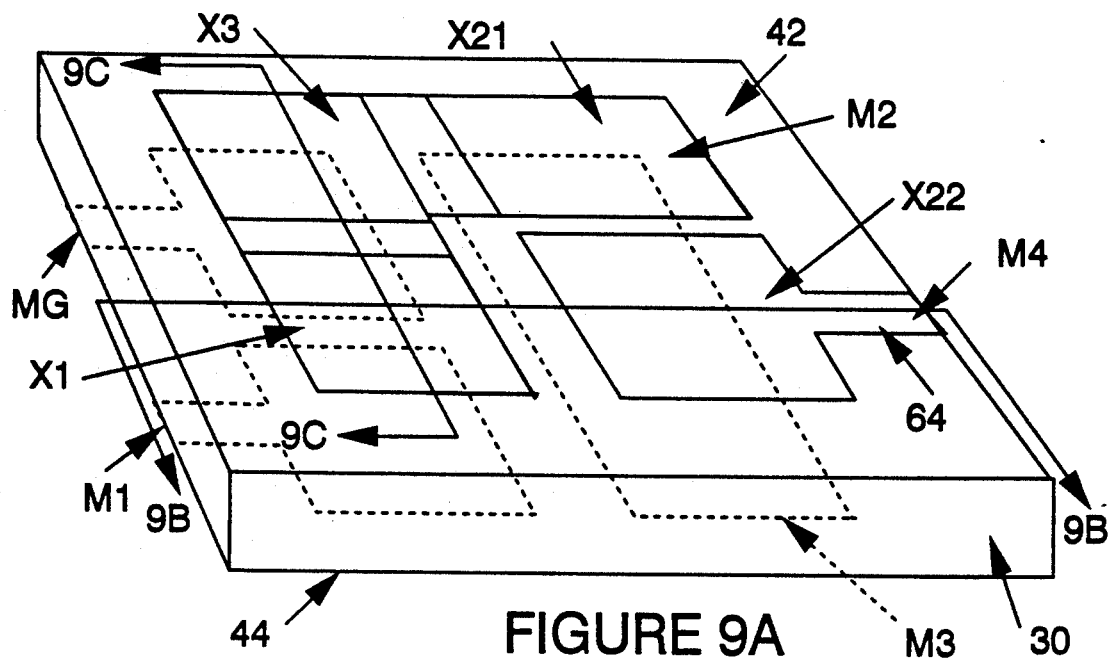
FIGS. 9A-C are perspective and cross sectional views of an implementation of the T network represented in FIG. 8.
Figure 9B:
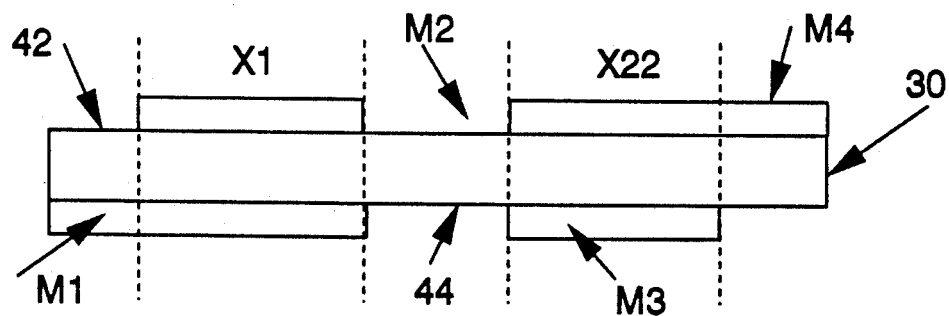
Figure 9C:
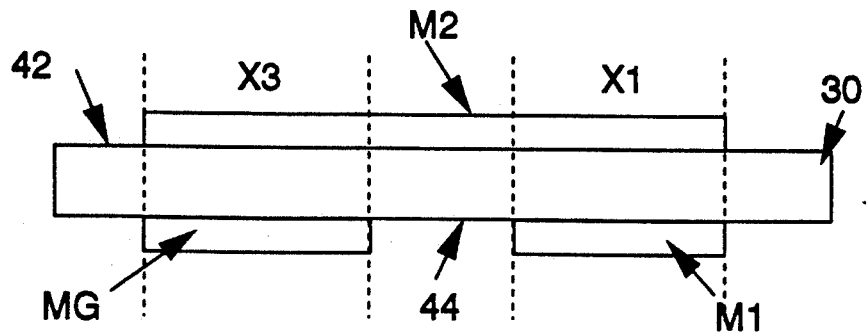

FIGS. 9A–C are perspective and is a cross sectional views of a monolithic implementation of the network of FIG. 8. With resonator X2 replaced with series connected resonators X21 and X22, the additional connecting electrode M4 is deposited on the upper material surface 42. Resonators X21 and X22 are formed by overlapping areas of electrodes M2, M3 and M4, as indicated by the dashed lines or heavy shading defining the resonators. The portion of electrode M4 outside the dashed lines defining resonator X22 forms a lead 64 on the upper surface 42 of piezoelectric material 30 for interconnecting the T network to other circuitry. With this additional electrode, electrode M2 may connect to an adjacent integrated circuit at lower surface 44 and electrode M4 may be bonded to a discrete component at upper surface 42.

Figure 10A:
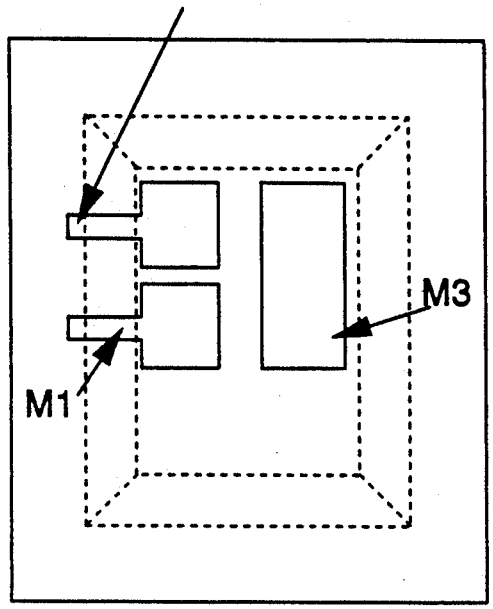
FIGS. 10A-D illustrate the process for fabricating the T network of FIG. 9.
Figure 10B:
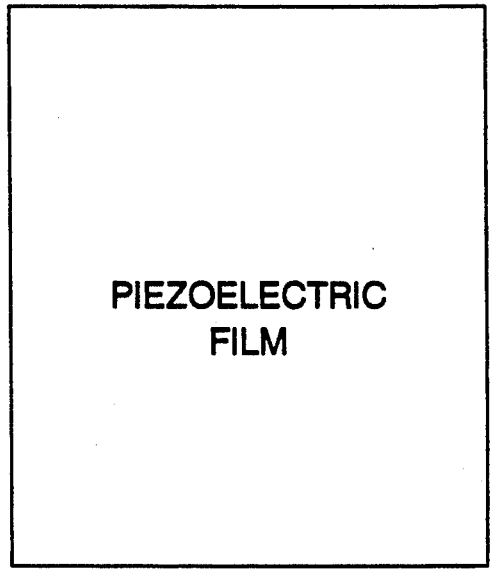
Figure 10C:
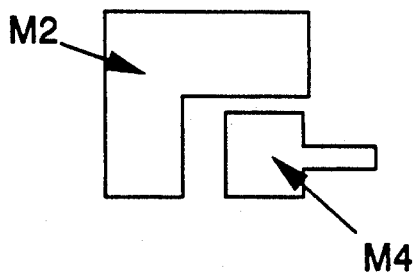
Figure 10D:
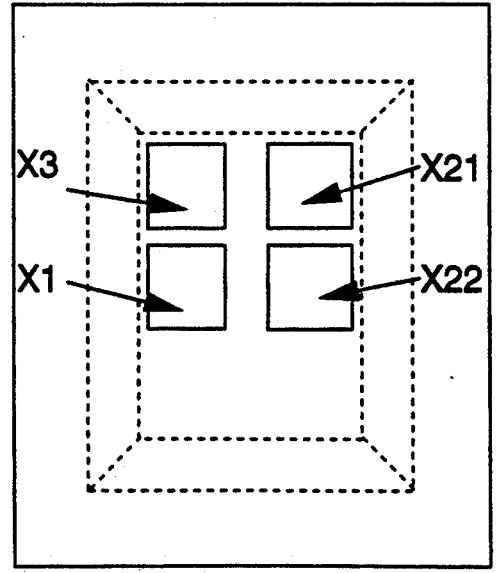

FIGS. 10A–D illustrate the process for fabricating the implementation of FIG. 8 as implemented in FIG. 9. FIG. 10A shows the first layer metalizations that form electrodes M1, M3 and MG. FIG. 10B shows the deposition of the piezoelectric material 30. FIG. 10C shows a second layer metalization that forms electrodes M2 and M4. FIG. 10D is a schematic view showing the relative locations of resonators X1, X21, X22 and X3 within the implementation of the T network.

If desired, resonator X3 of FIG. 8 may be decomposed to produce a pair of series connected resonators as the shunt element. This decomposition would place signal ground on an opposing surface of material 30 from other electrodes X1 and X2 that connect the network to other circuitry.

The method of the invention covers other resonator networks as well. FIG. 11 shows the topology of a conventional pi network within a circuit. The network comprises several series connected resonators X1, X2 and X3. Electrode M1 is shared by resonators X1 and X2 and provides a lead for interconnecting the network to other circuitry such as resistor $R_8$ to receive an input for the network. Similarly, electrode M2 is shared by resonators X1 and X3 and provides a lead for interconnecting the network to other circuitry such as resistor $R_1$ to provide an output for the network. Electrodes MG1 and MG2 complete resonators X2 and X3, respectively, and are leads for interconnecting the network to signal ground. These electrodes, however, are on opposing surfaces of the piezoelectric material 30 because of the circuit topology.

FIG. 12 is a perspective view of a monolithic implementation of the pi network of FIG. 11. Electrodes M1 and MG2 are on upper material surface 42 and electrodes MG1 and M2 is adjacent to the lower material surface 44.

Figure 13:
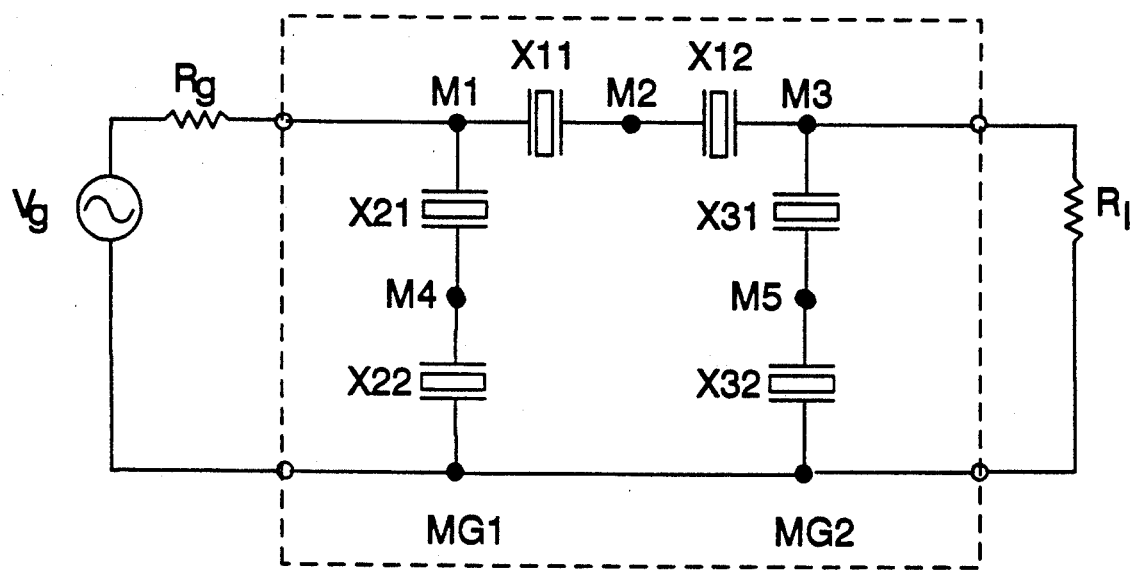
FIG. 13 is a schematic diagram of an equivalent pi network formed by decomposing each resonator of the network into a pair of series connected resonators.

The topology of the circuit in FIG. 11 has a distinct disadvantage when implemented in either monolithic or discrete form. The electrodes MG1 and MG2 are on opposing surfaces of piezoelectric material 30, although they are both signal ground. To join them requires a nonplanar interconnect. If the two electrodes were on the same surface, however, they could be combined into a single electrode. If it is desired to connect electrode M2 to other circuitry at the lower surface 44, then a nonplanar interconnect from electrode M2 to the lower surface is required These disadvantages are overcome by application of the present method to optimize the circuit's topology FIG. 13 is a schematic diagram of an equivalent pi network formed according to the method by decomposing each resonator into a pair of series connected resonators Resonator X1 is replaced with series connected resonators X11 and X12, adding an additional electrode M3. Resonator X2 is replaced with series connected resonators X21 and X22, adding an additional electrode M4. Resonator X3 is replaced with series connected resonators X31 and X32, adding an additional electrode M5. In each case, the composite characteristics of the series connected resonators are chosen to match the characteristics of the replaced resonator so that the pi network's electrical characteristics remain unchanged.

The replacement of resonators X2 and X3 is optional, depending only on the desired location of the signal ground electrode MG. An equivalent pi network that includes resonators X2 and X3 would comprise a first pair of resonators such as X11 and X2 sharing a first electrode for connection to other circuitry. A second pair of resonators such as X12 and X3 would share a second electrode for connection to other circuitry. A series connected pair of resonators would then be formed comprising resonators X11 and X12 and a third electrode such as electrode M2. The series connected pair of resonators would be the only connections to electrode M2.

Figure 14:
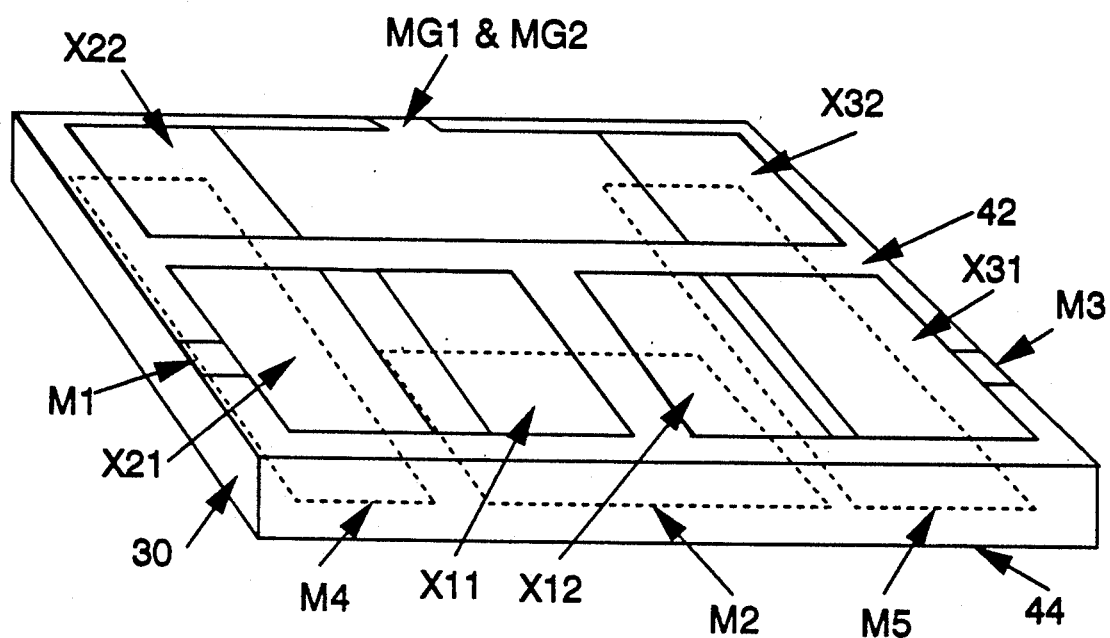
FIG. 14 is a perspective view of an implementation of the pi network represented in FIG. 13.

FIG. 14 is a perspective view of a monolithic implementation of the equivalent network of FIG. 13, taken to show the coplanar electrodes M1, M3, MG1, and MG2 mounted on upper surface 42 for connection to other circuitry. Electrodes M2, M4 and M5 are adjacent to the lower surface 44 of the piezoelectric material 30 electrodes MG1 and MG2 are also mounted to the lower surface 42. Electrodes MG1 and MG2 are combined into a single electrode. Alternatively, electrodes M1 and M3 may be mounted adjacent to the lower surface 44, with the positions of the other electrodes reversed accordingly, by changing the fabrication steps. If it is desired to have electrodes MG1 and MG2 on a surface opposing the electrodes M1 and M3, then resonators X2 and X3 are not decomposed and electrodes M4 and M5 are not added.

Figure 15A:
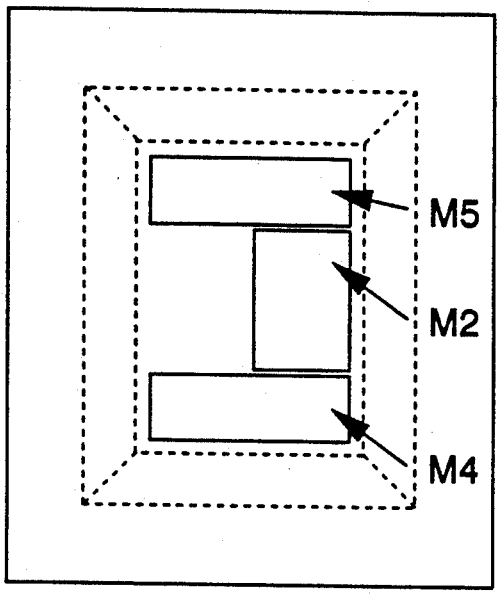
FIGS. 15A-D illustrate the process for fabricating the pi network represented in FIG. 14.
Figure 15B:
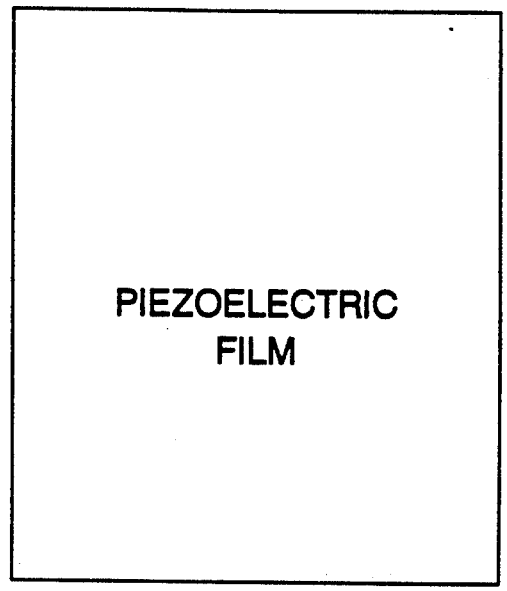
Figure 15C:
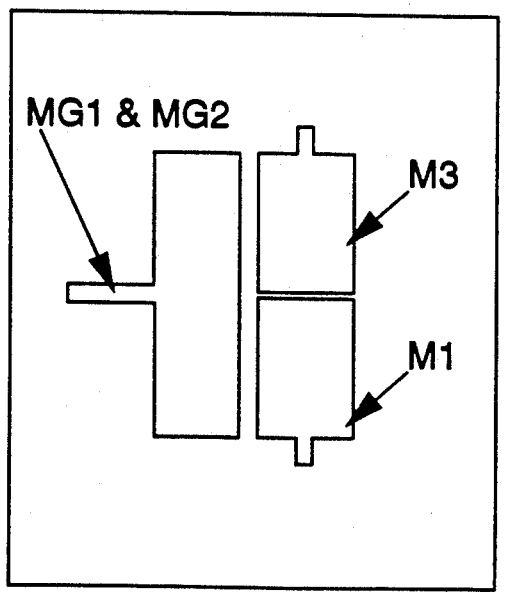
Figure 15D:
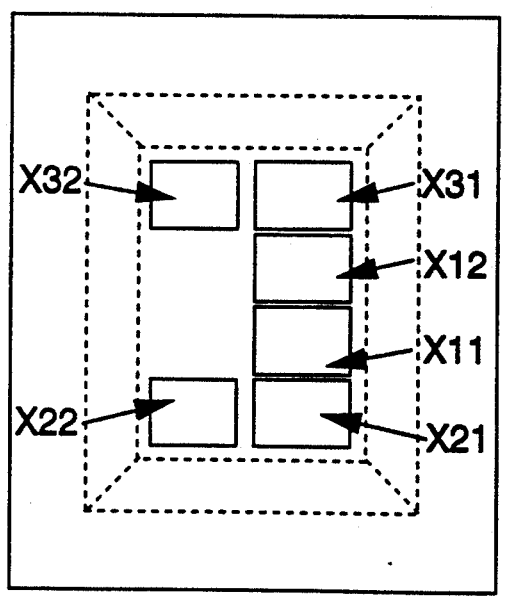

FIGS. 15A-D illustrate the process for fabricating the series connected resonators of FIG. 13 as implemented in FIG. 14. FIG. 15A shows the first layer metalizations that form electrodes and MG2, M2, M4 and M5. FIG. 15B shows the deposition of the piezoelectric material 30. FIG. 15C shows a second layer metalization that forms electrodes M1, M3 and MG1 and MG2 combined. FIG. 15D is a schematic view showing the relative locations of the six resonators within the monolithic implementation of the pi network.

The optimizing method also covers networks such as L networks. FIG. 16 shows the topology of a conventional L-network within an electrical circuit. The L network comprises a series resonator X1 and a shunt element such as resonator X2. Electrode M1 of a resonator X1 provides a lead for interconnecting the network to other circuitry such as resistor Rg to receive an input for the network. Similarly, electrode M2, which is shared by resonators X1 and X2, provides a lead for interconnecting the network to other circuitry such as resistor $R_1$ to provide an output for the network. Electrode MG completes resonator X2 and is a lead for interconnecting the network to signal ground.

FIG. 17 is a perspective view of an implementation of the network of FIG. 16 show only resonator X1. It can be readily seen that the electrodes M1 and M2 are on opposing surfaces of the piezoelectric material 30. If both leads 38 and 40 are to be located on lower surface 44 of material 30, then lead 40 will have to be moved to lower surface 44 to be connected to a bonding pad on the upper surface 42.

Figure 18:
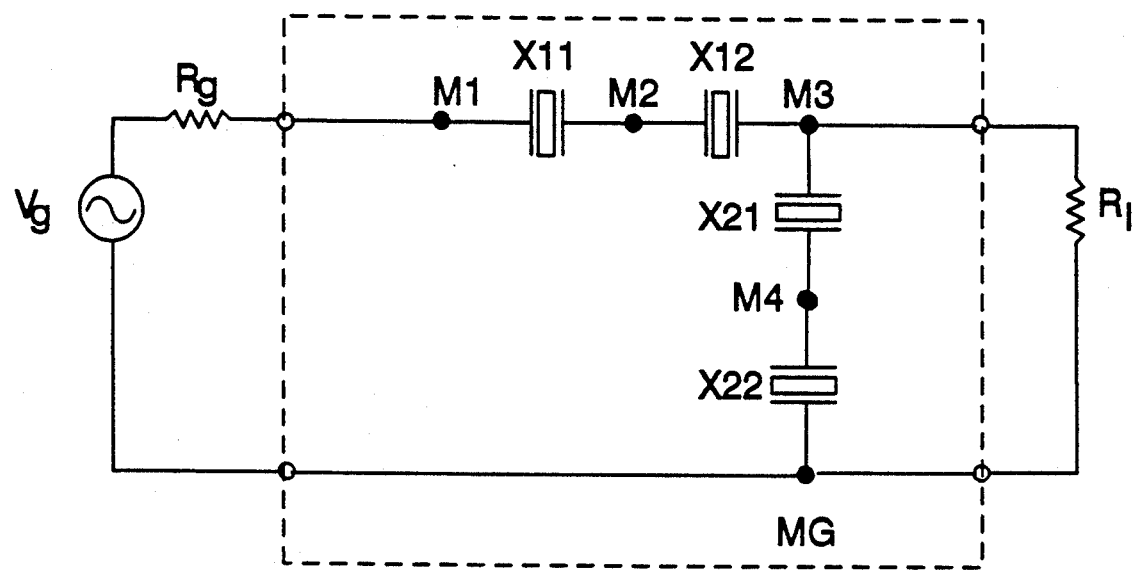
FIG. 18 is schematic diagram of an equivalent L network formed by decomposing each of its resonators into a pair of series connected resonators.

With the method of the invention, this connection is made by decomposing resonator X1 into series connected resonators X11 and X12, as shown in the schematic diagram of FIG. 18. This adds an additional electrode M3 on the upper surface 42. It is desirable to have electrode MG (signal ground) on the upper surface as well, then resonator X2 should be decomposed into series connected resonators X21 and X22, adding the additional floating electrode M4. The optimized L network thus comprises a first resonator such as X12 that includes a first electrode M3 for connection to other circuitry. A shunt element such as resonator X2 of FIG. 16 is connected to the resonator X12 at electrode M3. To add the additional electrode needed for connecting at upper surface 42, resonator X11 is series connected to resonator X12 at electrode M2. Resonators X11 and X12 are the only connections to electrode M2. The series connected resonators place electrode M1 on the same upper surface 44, as electrode M3.

Figure 19:
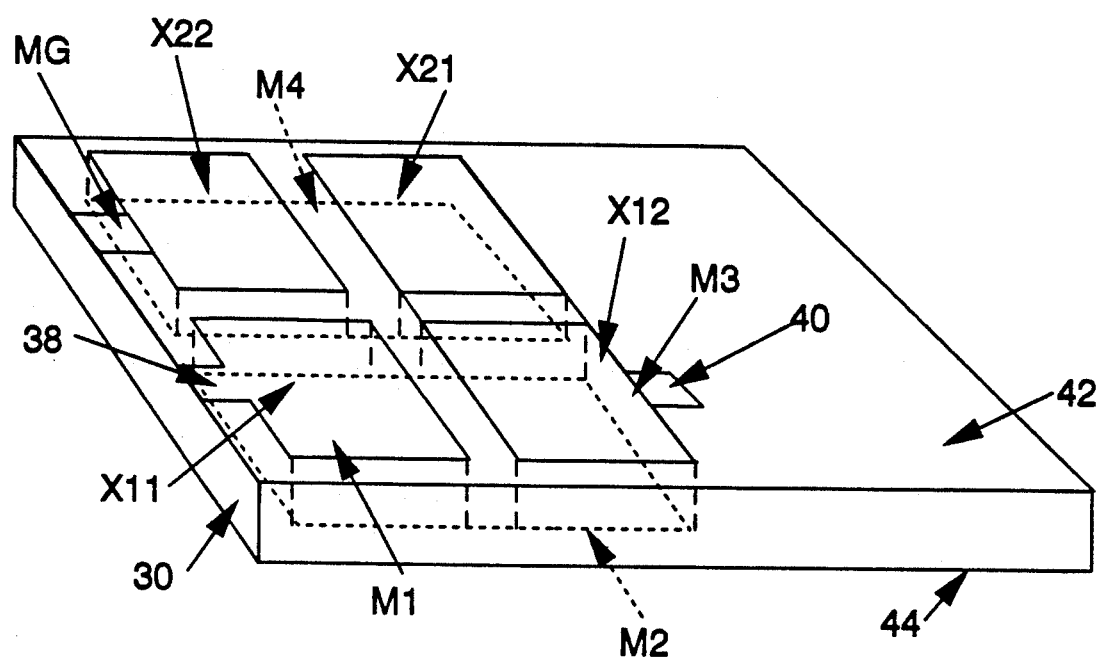
FIG. 19 is a perspective view of an implementation of the L network represented in FIG. 18.

FIG. 19 is a perspective view of a monolithic implementation of the equivalent network of FIG. 18, taken to show the coplanar electrodes M1 and M3 on upper surface 42. Alternatively, electrodes M1 and M3 may be mounted adjacent to the lower surface 44, with the positions of the other electrodes reversed accordingly. If it is desired to have electrode MG on a surface opposing electrodes M1 and M3, then resonator X2 is not decomposed and electrode M4 is not added.

Figure 20A:
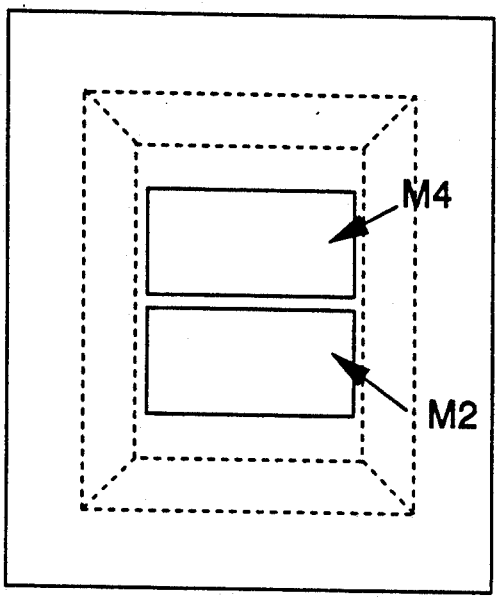
FIGS. 20-D illustrate the process for fabricating the L network of FIG. 19.
Figure 20B:
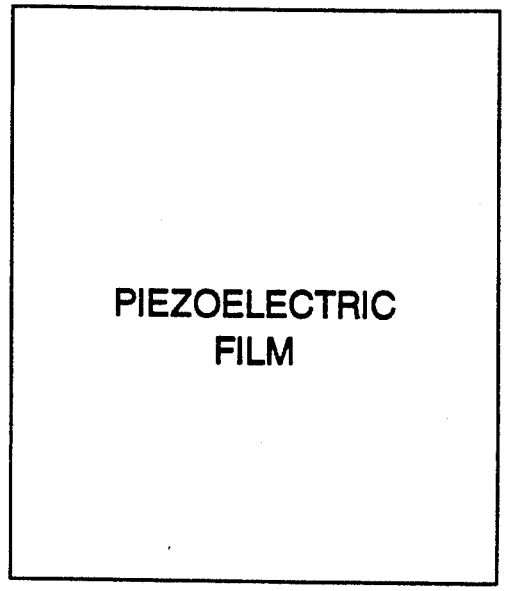
Figure 20C:
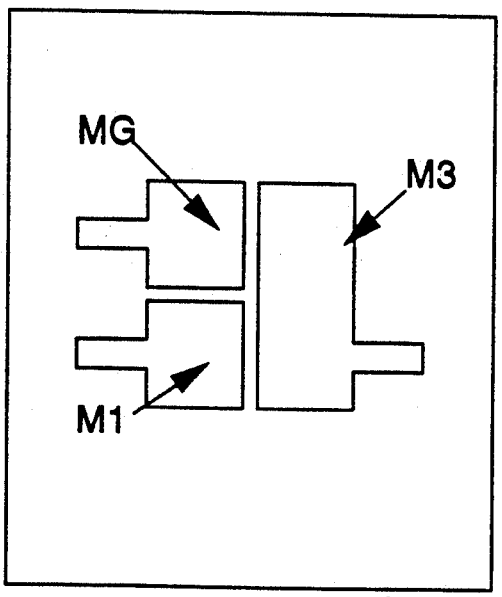
Figure 20D:
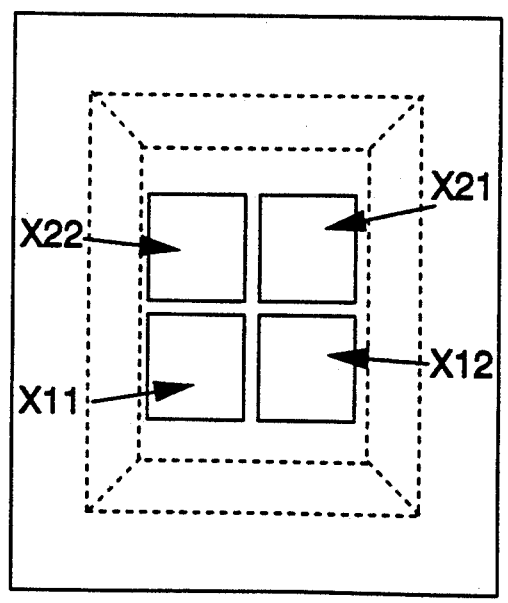

FIGS. 20A-D illustrate the process for fabricating the series connected resonators of FIG. 18 as implemented in FIG. 19. FIG. 20A shows the first layer metalization that form electrodes M1 and M3 and signal ground electrodes M2 and M4 piezoelectric material 30. FIG. 20C shows a second layer metalization that forms electrodes M1, M3 and MG. FIG. 20D is a schematic view showing the relative locations of the four resonators within the monolithic implementation of the optimized L network.

The method is not limited, of course, to the basic resonator networks described above. It may be applied wherever it is desirable to place an electrode on a specific surface of the piezoelectric material for making a connection to other circuitry. The versatility of the method can be seen in optimizing the circuit of FIG. 21. The circuit shown is a T ladder network comprising a number of piezoelectric resonators and shunt elements that may also be piezoelectric resonators.

Figure 21:
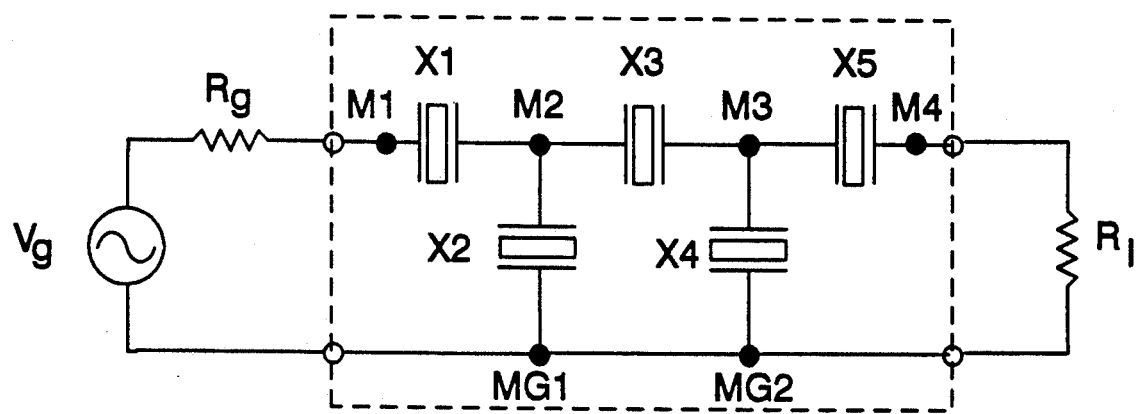
FIG. 21 is a schematic diagram of an electrical circuit that includes a ladder network comprising piezoelectric resonators and shunt elements.
Figure 22:
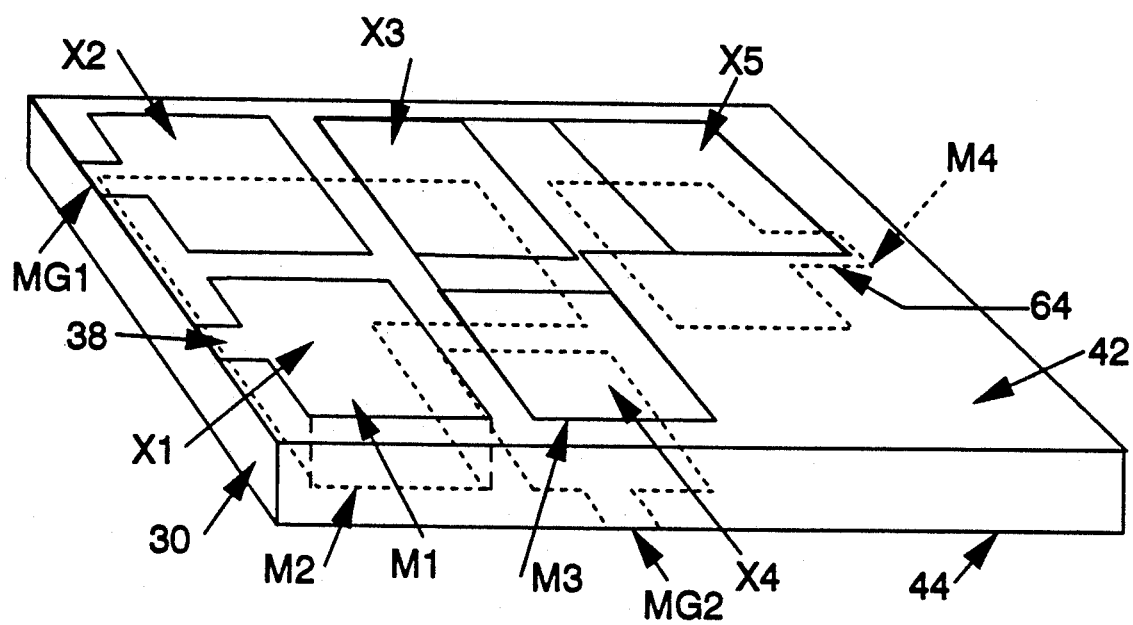
FIG. 22 is a perspective view of a monolithic implementation of the ladder network represented in FIG. 21.

FIG. 22 is a cross sectional view of the ladder network of FIG. 21, resonators X1, X2 and X3. It can be readily seen that the electrode M2 is adjacent to upper surface 42 and electrode M4 adjacent to lower surface 44 of the piezoelectric material 30. Consequently lead 38 of electrode M2 is exposed on the upper surface and lead 64 of electrode M4 is adjacent to the piezoelectric material's lower surface 44. If electrode M4 is to be bonded to discrete components, then lead 64 must be connected to the upper surface 42.

Figure 23:
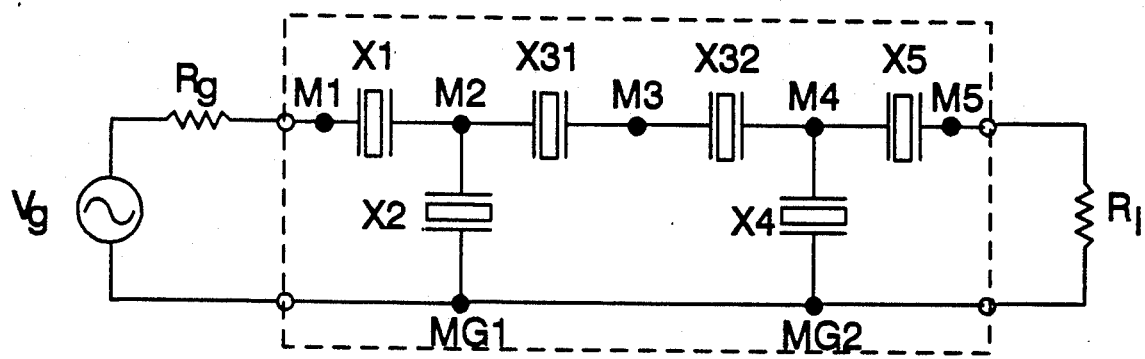
FIG. 23 is a schematic diagram of an equivalent ladder network formed by decomposing a resonator of the network into a pair of series connected resonators.
Figure 24:
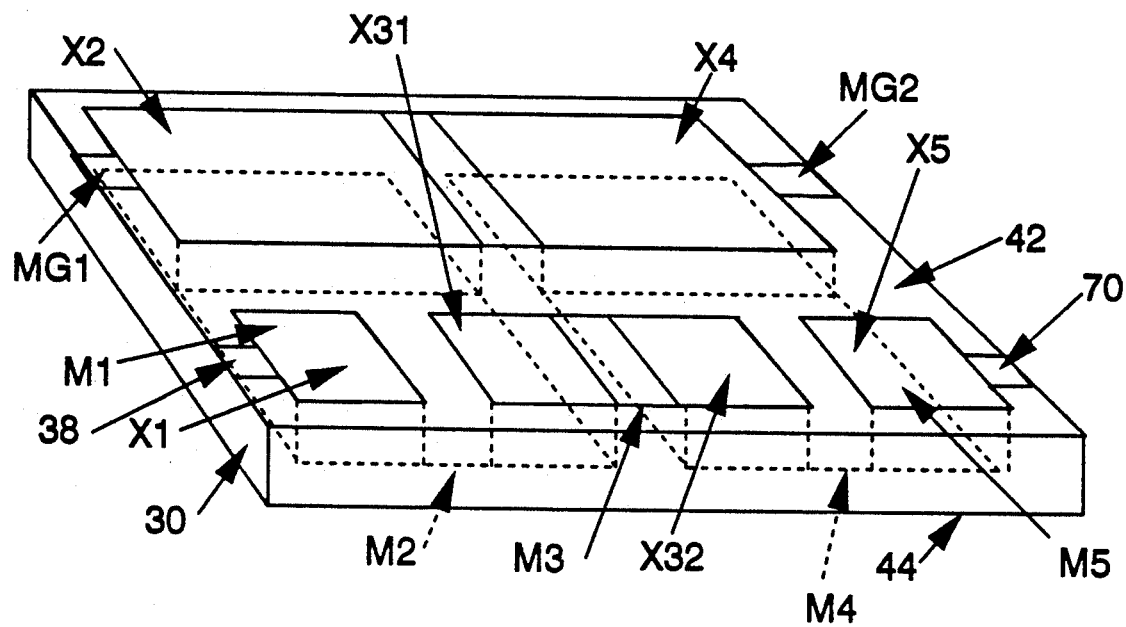
FIG. 24 is a perspective view of an implementation of the ladder network represented in FIG. 23.

With the method of the invention, this connection can be made by decomposing resonator X2 into series connected resonators X21 and X22, as shown in the schematic diagram of FIG. 23. This adds an additional electrode M5 on the upper surface 42, as shown in FIG. 24, with its own lead 70. Both leads 38 and 70, which connect the ladder network to other circuitry, are now in a position where such connection may be easily made. Electrodes MG1 and MG2 (signal grounds) are also on upper surface 42 for ease of connection.

Figure 25A:
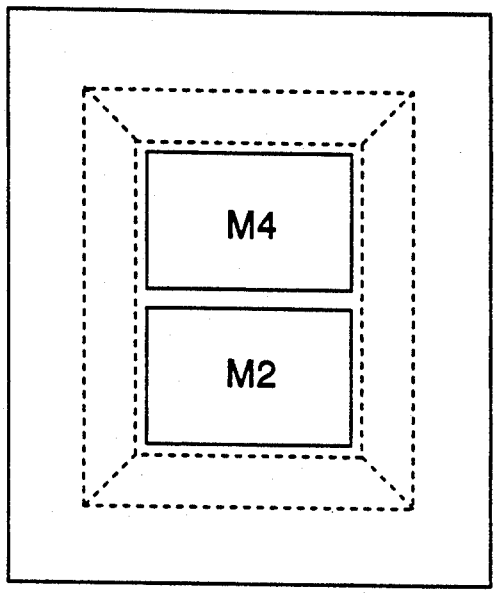
FIG. 25 illustrates the process for fabricating the ladder network of FIG. 24.
Figure 25B:
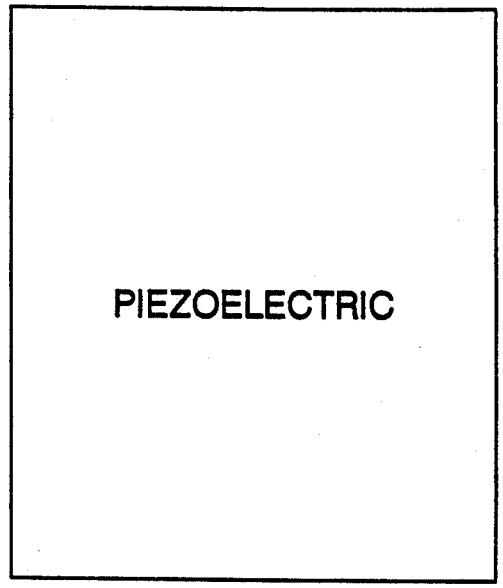
Figure 25C:
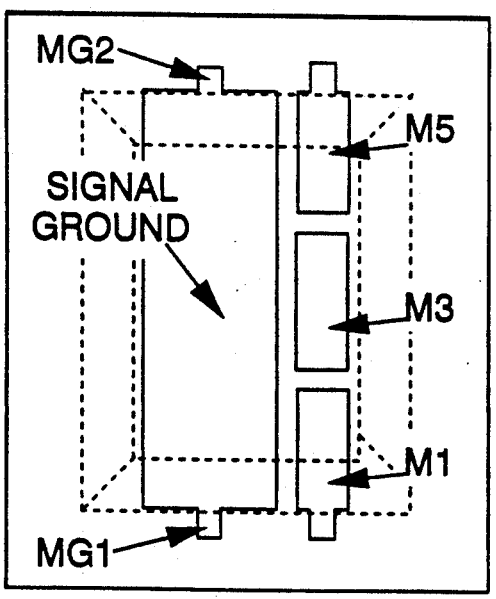
Figure 25D:
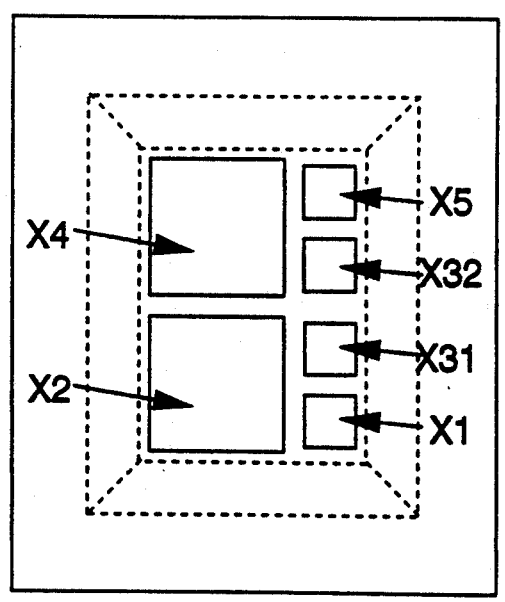

FIGS. 25A–D illustrate the process for fabricating the series connected resonators of FIG. 23 as implemented in FIG. 24. FIG. 25A shows the first layer metalizations that form electrodes M2 and M4. FIG. 25B shows the deposition of the piezoelectric material 30. FIG. 25C shows a second layer metalization that forms electrodes M1, M3, M5 and signal ground electrode MG1 and MG2. FIG. 25D is a schematic view showing the relative locations of the six resonators within the monolithic implementation of the optimized T ladder network.

Similar implementations made be constructed for generalized pi and L ladder networks.

Having illustrated and described the principles of the invention in several preferred embodiments, it should be apparent to those skilled in the art that the invention can be modified in arrangement and detail without departing from such principles. For example, these principles are readily applied to discrete implementations of piezoelectric-based resonator networks as well as monolithic implementations. I therefore claim all modifications coming within the spirit and scope of the following claims.

I claim:

1. A piezoelectric resonator-based T network comprising:
    a pair of series connected piezoelectric resonators sharing a first electrode;
    a shunt element connected to the first electrode and to a signal ground; and
    a third piezoelectric resonator series connected to one of the pair of series connected resonators at a second electrode,
    the third resonator and the series connected resonator being the only connections to the second electrode.

2. The piezoelectric resonator-based network of claim 1 in which the shunt element comprises a piezoelectric resonator.

3. The piezoelectric resonator-based network of claim 1 in which the third resonator is series connected to one of the pair of series connected resonators to place electrodes on opposing surfaces of the piezoelectric material for connecting the network to other circuitry.

4. A piezoelectric resonator-based pi network comprising:
    a first pair of resonators sharing a first electrode for connection to other circuitry;
    a second pair of resonators sharing a second electrode for connection to other circuitry; and
    a series connected pair of resonators comprising a resonator from each of the first and second pairs and sharing a third electrode, the series connected pair being the only connections to the third electrode.

5. The piezoelectric resonator-based network of claim 4 in which the pair of series connected resonators place electrodes on the same surface of the piezoelectric material for connecting the network to other circuitry.

6. A piezoelectric resonator-based L network comprising:
    a first resonator including a first electrode for connection to other circuitry;
    a shunt element connected to the first resonator at the first electrode; and
    a second resonator series connected to the first resonator at a second electrode,
    the second resonator and the first resonator being the only connections to the second electrode.

7. The piezoelectric resonator-based network of claim 6 in which the second resonator is series connected to the first resonator to place electrodes on the same surface of the piezoelectric material for connecting the network to other circuitry.

8. A piezoelectric resonator comprising:
    a layer of piezoelectric material;
    a pair of electrodes mounted on one surface of the piezoelectric material; and
    a third electrode mounted on an opposing surface of the piezoelectric material,
    each electrode of the pair mounted in overlapping relation to the third electrode to create two series connected resonators that are the only connections to the third electrode.

9. The piezoelectric resonator of claim 8 in which the two series connected resonators have identical resonant frequency.

10. The piezoelectric resonator of claim 8 in which each electrode of the pair is for connection to other circuitry.

* * * * *

(12) EX PARTE REEXAMINATION CERTIFICATE (8462nd)
United States Patent
Ketcham

(10) Number: US 5,231,327 C1
(45) Certificate Issued: Aug. 16, 2011

(54) OPTIMIZED PIEZOELECTRIC RESONATOR-BASED NETWORKS AND ASSOCIATED METHOD

(75) Inventor: Richard S. Ketcham, Ames, IA (US)

(73) Assignee: Triquint Semiconductor, Inc., Hillsboro, OR (US)

Reexamination Request:
No. 90/010,662, Sep. 2, 2009

Reexamination Certificate for:
Patent No.: 5,231,327
Issued: Jul. 27, 1993
Appl. No.: 07/628,440
Filed: Dec. 14, 1990

(51) Int. Cl.
*H03H 9/00* (2006.01)
*H03H 9/56* (2006.01)

(52) U.S. Cl. .................. 310/366; 310/320; 333/189; 333/191

(58) Field of Classification Search .................. None
See application file for complete search history.

(56) References Cited

U.S. PATENT DOCUMENTS

| | | | |
|---|---|---|---|
| 1,734,112 A | 11/1929 | Carson |
| 1,975,517 A | 10/1934 | Nicolson |
| 2,045,991 A | 6/1936 | Mason |
| 2,277,709 A | 3/1942 | McSkimin |
| 2,373,431 A | 4/1945 | Sykes |
| 2,406,796 A | 9/1946 | Bies |
| 2,814,021 A | 11/1957 | Oswald |
| 2,969,512 A | 1/1961 | Jaffe |
| 3,209,178 A | 9/1965 | Koneval |
| 3,222,622 A | 12/1965 | Curran |
| 3,344,368 A | 9/1967 | Fettweis |
| 3,358,249 A | 12/1967 | Kawakami |
| 3,396,327 A | 8/1968 | Nakazawa |
| 3,401,275 A | 9/1968 | Curran |
| 3,401,276 A | 9/1968 | Curran |
| 3,437,848 A | 4/1969 | Borner |
| 3,486,046 A | 12/1969 | Zalar |
| 3,488,530 A | 1/1970 | Staudte |
| 3,528,851 A | 9/1970 | Koneval |
| 3,548,346 A | 12/1970 | Page |
| 3,558,351 A | 1/1971 | Foster |
| 3,559,116 A | 1/1971 | Egerton |
| 3,560,894 A | 2/1971 | Fettweis |
| 3,564,463 A | 2/1971 | Beaver |
| 3,568,108 A | 3/1971 | Poirier |
| 3,573,960 A | 4/1971 | Duncan |

(Continued)

FOREIGN PATENT DOCUMENTS

| | | |
|---|---|---|
| JP | 55-028663 | 2/1980 |
| JP | 58-139517 | 8/1983 |
| JP | 58-221513 | 12/1983 |

OTHER PUBLICATIONS

Counter Defendants' Technology Tutorial, Bulk Acoustic Wave (BAW) Devices—A Technology Overview (filed Dec. 2, 2010), 258 pages.

*Primary Examiner*—Anjan K. Deb

(57) ABSTRACT

The method comprises decomposing an original resonator within a network into a pair of series connected resonators to add an additional connecting electrode to the network. The pair of resonators are series connected by a shared electrode. To preserve the original electrical characteristics of the network, the composite characteristics of the series connected resonators are chosen to match those of the original resonator. With this method, the additional electrode is placed on a surface of the piezoelectric material opposing the surface to which the shared electrode is mounted. The method allows for the addition of an electrode to a piezoelectric resonator-based network so that the electrodes which connect the network to other circuitry may be placed where desired. This may be on the upper surface of the piezoelectric material for connection to discrete components or on the lower, buried surface for connection to buried layers of an adjacent integrated circuit.

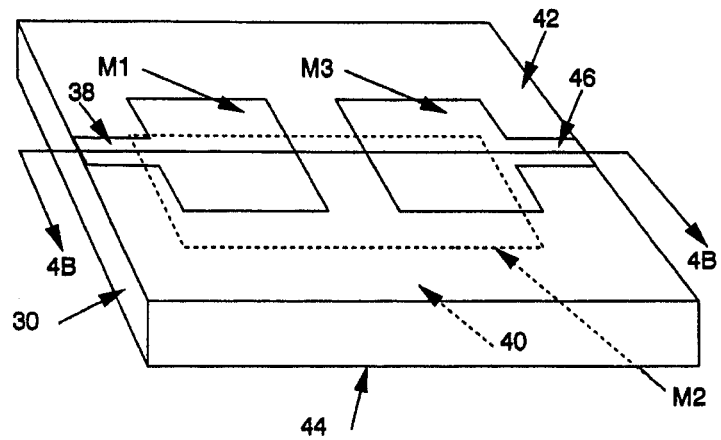

U.S. PATENT DOCUMENTS

| | | |
|---|---|---|
| 3,576,453 A | 4/1971 | Mason |
| 3,593,218 A | 7/1971 | Wood |
| 3,634,787 A | 1/1972 | Newell |
| 3,676,724 A | 7/1972 | Berlincourt |
| 3,697,788 A | 10/1972 | Parker |
| 3,697,903 A | 10/1972 | Sauerland |
| 3,739,304 A | 6/1973 | Braun |
| 3,747,176 A | 7/1973 | Toyoshima |
| 3,764,848 A | 10/1973 | Berlincourt |
| 3,766,041 A | 10/1973 | Wasa |
| 3,832,761 A | 9/1974 | Sheahan |
| 3,836,877 A | 9/1974 | Guntersdorfer |
| 3,846,649 A | 11/1974 | Lehmann |
| 3,878,407 A | 4/1975 | Hartemann |
| 3,896,401 A | 7/1975 | Yano |
| 3,924,312 A | 12/1975 | Coussot |
| 3,961,210 A | 6/1976 | Nagata |
| 3,983,518 A | 9/1976 | Bezemer |
| 4,066,986 A | 1/1978 | Takano |
| 4,142,124 A | 2/1979 | Ogawa |
| 4,149,102 A | 4/1979 | Kellen |
| 4,163,959 A | 8/1979 | Dailing |
| 4,164,676 A | 8/1979 | Nishiyama |
| 4,189,516 A | 2/1980 | Dryburgh |
| 4,196,407 A | 4/1980 | Masaie |
| 4,214,018 A | 7/1980 | Halon |
| 4,218,631 A | 8/1980 | Yamaguchi |
| 4,229,506 A | 10/1980 | Nishiyama |
| 4,246,554 A | 1/1981 | Swanson |
| 4,287,493 A  * | 9/1981 | Masaie ....................... 333/191 |
| 4,297,189 A | 10/1981 | Smith |
| 4,302,108 A | 11/1981 | Timson |
| 4,320,365 A | 3/1982 | Black |
| 4,329,666 A | 5/1982 | Arvanitis |
| 4,345,176 A | 8/1982 | Grudkowski |
| 4,360,754 A | 11/1982 | Toyoshima |
| 4,365,181 A | 12/1982 | Yamamoto |
| 4,423,394 A | 12/1983 | Kinsman |
| 4,456,850 A | 6/1984 | Inoue |
| 4,480,488 A | 11/1984 | Read |
| 4,502,932 A | 3/1985 | Kline |
| 4,556,812 A | 12/1985 | Kline |
| 4,564,782 A | 1/1986 | Ogawa |
| 4,640,756 A | 2/1987 | Wang |
| 4,642,508 A | 2/1987 | Suzuki |
| 4,719,383 A | 1/1988 | Wang |
| 4,760,358 A | 7/1988 | Inoue |
| 4,833,430 A | 5/1989 | Roberts |
| 4,920,296 A | 4/1990 | Takahashi |
| 5,041,754 A | 8/1991 | Smythe |
| 5,075,651 A | 12/1991 | Pradal |
| 5,294,862 A | 3/1994 | Banno et al. |
| 5,570,070 A | 10/1996 | Ogawa et al. |

* cited by examiner

EX PARTE REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

The patentability of claim 1-5 and 9 is confirmed.

Claims 6-8 and 10 are cancelled.

* * * * *